(12) United States Patent
Teshirogi et al.

(10) Patent No.: US 7,820,487 B2
(45) Date of Patent: Oct. 26, 2010

(54) MANUFACTURING METHOD OF SEMICONDUCTOR DEVICE

(75) Inventors: Kazuo Teshirogi, Kawasaki (JP); Yuzo Shimobeppu, Kawasaki (JP); Kazuhiro Yoshimoto, Kawasaki (JP); Yoshiaki Shinjo, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/408,062

(22) Filed: Mar. 20, 2009

(65) Prior Publication Data
US 2009/0186451 A1    Jul. 23, 2009

Related U.S. Application Data

(63) Continuation of application No. PCT/JP2006/319142, filed on Sep. 27, 2006.

(51) Int. Cl.
*H01L 21/00* (2006.01)
(52) U.S. Cl. .................. 438/118; 438/108; 438/464; 257/E21.514
(58) Field of Classification Search .......... 438/108, 438/110, 113, 118, 119, 460, 462, 464
See application file for complete search history.

(56) References Cited

U.S. PATENT DOCUMENTS

2002/0168797 A1* 11/2002 DiStefano et al. ........... 438/106

FOREIGN PATENT DOCUMENTS

| JP | 9-116251 A | 5/1997 |
|---|---|---|
| JP | 11-54554 A | 2/1999 |
| JP | 2001-068603 A | 3/2001 |
| JP | 2003-234359 A | 8/2003 |
| JP | 2005-26311 A | 1/2005 |
| JP | 2006-179811 A | 7/2006 |

OTHER PUBLICATIONS

International Search Report of PCT/JP2006/319142, Mailing Date of Dec. 5, 2006.

* cited by examiner

*Primary Examiner*—Charles D Garber
*Assistant Examiner*—Reema Patel
(74) *Attorney, Agent, or Firm*—Fujitsu Patent Center

(57) ABSTRACT

A manufacturing method of a semiconductor device includes providing an adhesive on a supporting board, the supporting board being where a semiconductor element is to be mounted; providing a member configured to block flow of the adhesive on a first main surface of the semiconductor element, the semiconductor element having a second main surface where an outside connection terminal is provided; mounting the semiconductor element on a part of the supporting board where the adhesive is provided by pressing the semiconductor element via the member.

17 Claims, 23 Drawing Sheets

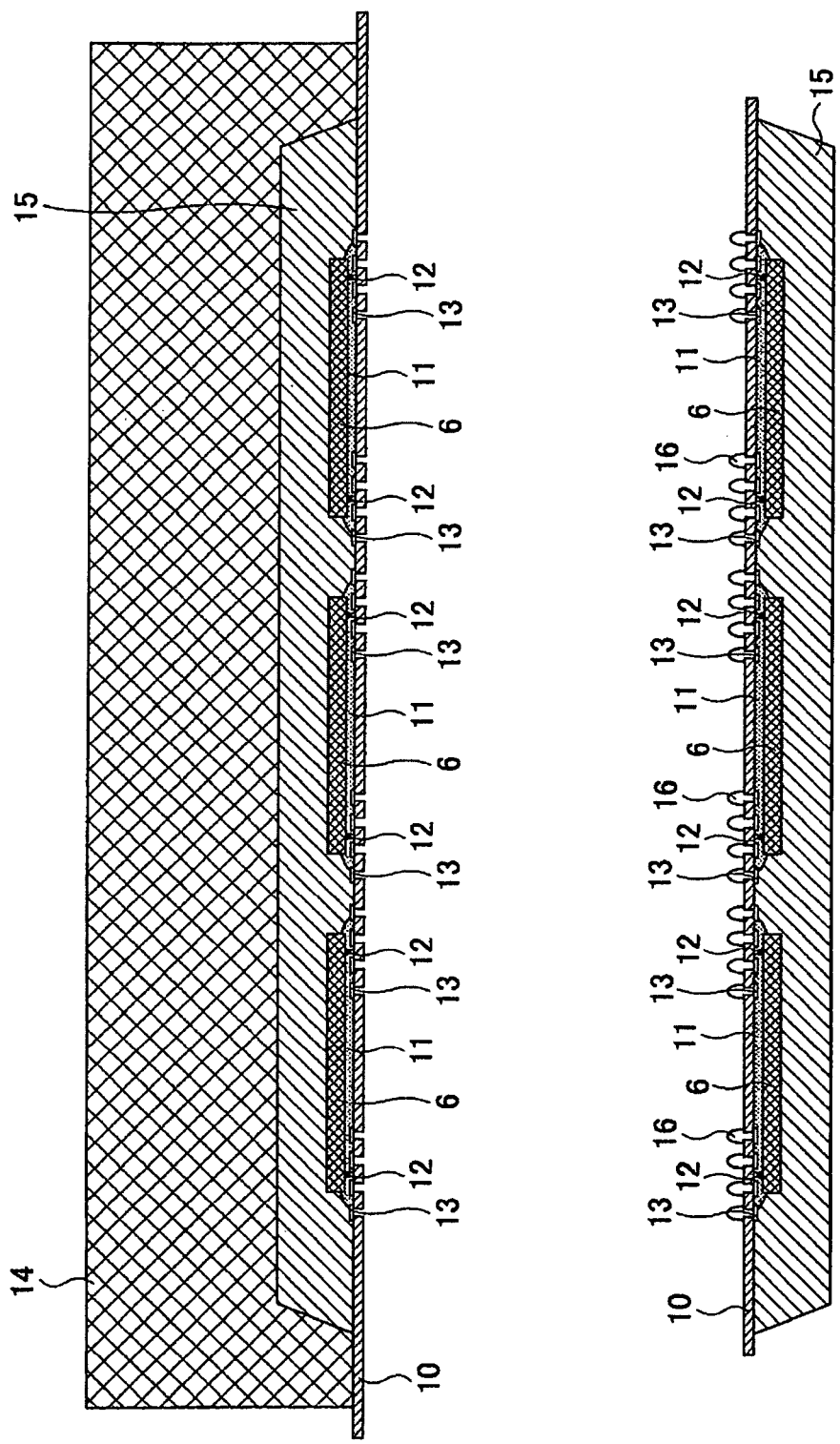

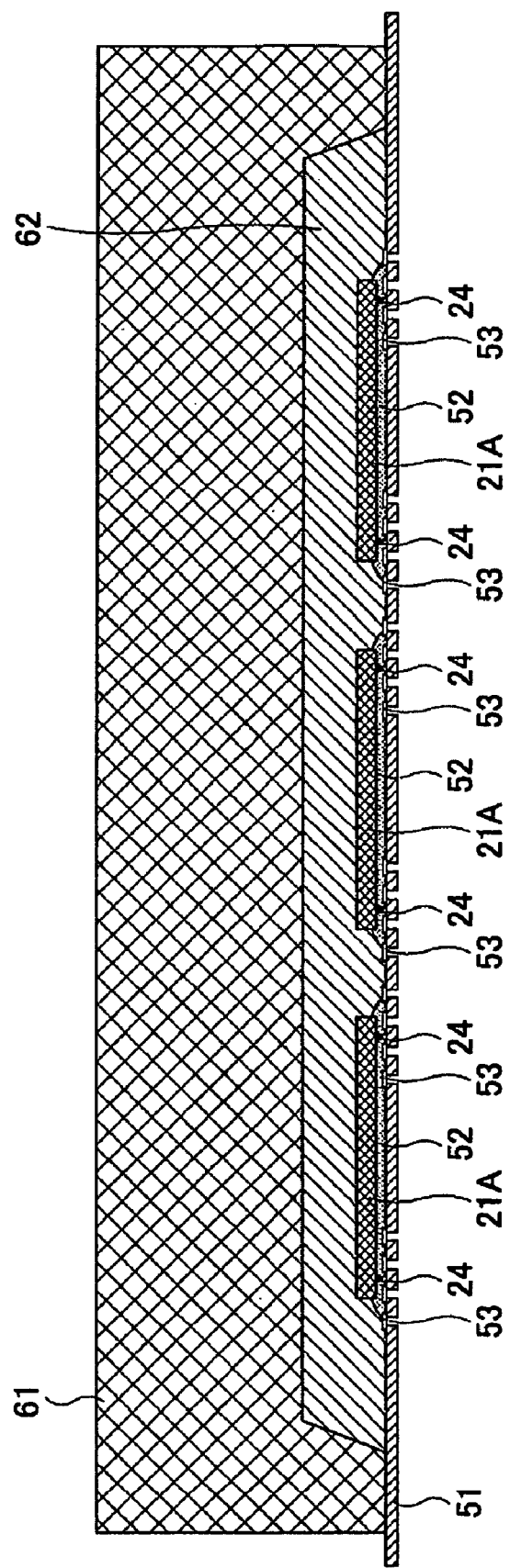

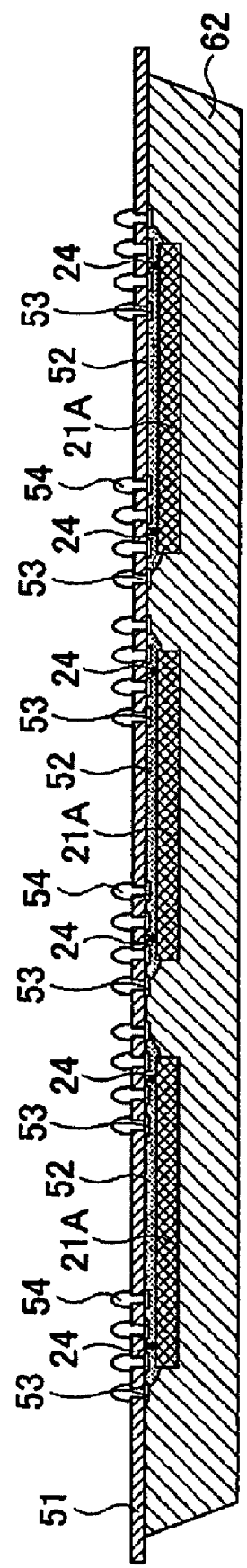

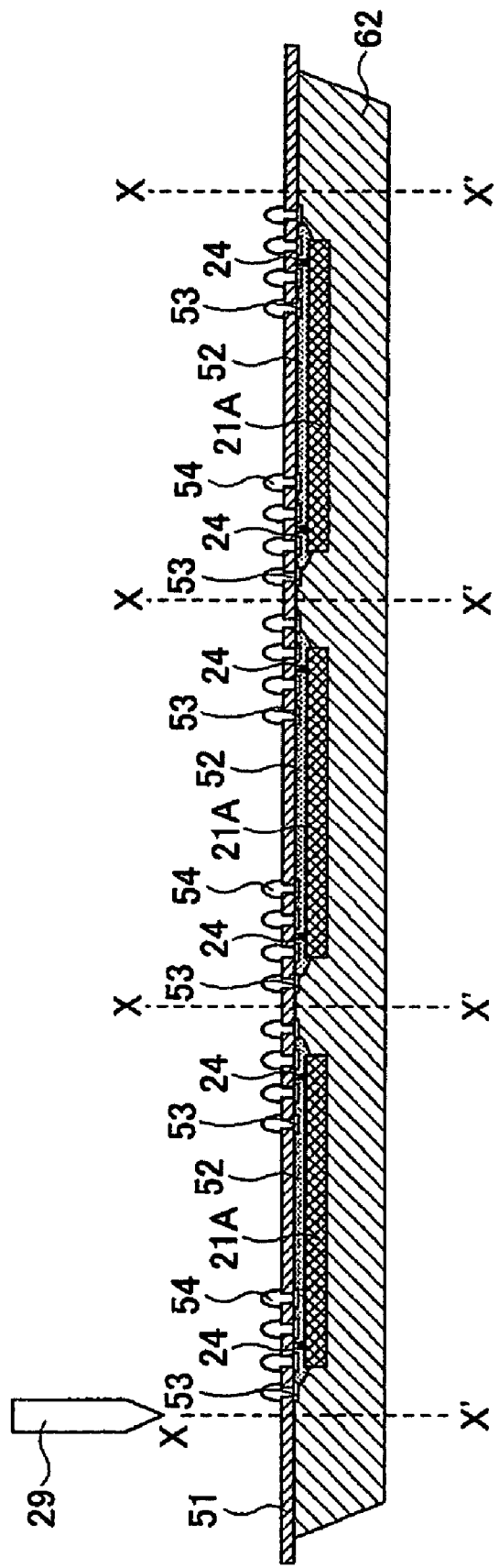

MANUFACTURING METHOD OF SEMICONDUCTOR DEVICE

CROSS-REFERENCE TO RELATED APPLICATIONS

This patent application is based upon and claims the benefit of priority under 35 USC 120 and 365(c) of PCT application JP2006/319142 filed in Japan on Sep. 27, 2006, the entire contents of which are incorporated herein by reference.

FIELD

The embodiments discussed herein are related to manufacturing methods of semiconductor devices.

BACKGROUND

As a means for mounting a semiconductor element on a supporting board such as a circuit board, so-called flip chip mounting (mounting in a face-down manner) is applied. In the flip chip mounting, a main surface (a surface where an electronic circuit is formed) of the semiconductor element faces the supporting board. Projection electrodes called bumps made of conductive materials are provided on the main surface of the semiconductor element and the projection electrodes are connected to electrode terminals on the supporting board.

As a manufacturing method of a semiconductor device including the flip chip mounting (mounting in the face down manner), the following method has been conventionally used. A manufacturing method of a semiconductor device of the related art is illustrated in FIG. 1 through FIG. 4.

A semiconductor substrate (wafer) 1 is prepared having a main surface where a so-called wafer process is applied so that plural semiconductor elements (LSI elements) are formed. An ultraviolet (UV) curing type dicing tape 2 is adhered on a rear surface (electronic circuit non-forming surface) of the semiconductor substrate 1. The semiconductor substrate 1 is fixed to a wafer ring (frame) 3 via the dicing tape 2. See FIG. 1A. On another main surface (semiconductor element forming surface) of the semiconductor substrate 1, projection electrodes (bumps) as outside connection terminals are provided in each area of the semiconductor elements.

Next, the semiconductor substrate 1 is divided vertically and horizontally (orthogonally) by a blade dicing method using a dicing saw 4 so that each of the semiconductor elements is cut off and separated from the semiconductor substrate 1. See FIG. 1B.

Next, ultraviolet (UV light) is applied from a rear surface side of the dicing tape 2 so that an adhesive layer of the dicing tape 2 is cured. See FIG. 1C. As a result of this, adhesive strength of the dicing tape 2 is reduced so that the semiconductor element having been cut off can be peeled off.

After that, a thrust-up pin (not illustrated in FIG. 1) is pushed up from underneath the dicing tape 2 so that the semiconductor element having been cut off is peeled off from the dicing tape 2. Simultaneously, by using an absorption tool 5 waiting above, a semiconductor element 6 is attracted and transferred to a tray 7. See FIG. 2D. As a result of this, the semiconductor element 6 is received in the tray 7.

Next, the semiconductor element 6 received in the tray 7 is picked up by using a pick-up tool 8. Then, the pick-up tool 8 is inverted up and down so as to pass the semiconductor element 6 to a bonding tool 9 waiting above. See FIG. 2E.

On the other hand, an adhesive 11 made of thermosetting resin or the like such as paste epoxy group resin is applied to a portion of an upper surface of a wiring board 10 where the semiconductor element 6 is mounted and fixed in the following step. See FIG. 2F.

Next, by using an image processing apparatus (not illustrated in FIG. 2), the semiconductor element 6 and the wiring board 10 are positioned. The semiconductor element 6 is flip-chip mounted (mounted in a face-down manner) on the wiring board 10 while heating and pressing are applied by using the bonding tool 9. See FIG. 2G.

As a result of this, projection electrodes (bumps) 12 provided on the semiconductor elements 6 are connected to electrodes 13 of the wiring board 10. See FIG. 3H.

At this time, the adhesive 11 (see FIG. 2F) is cured by heating so that the adhesion of the semiconductor elements 6 and the wiring board 10 is strengthened and parts where the semiconductor elements 6 and the wiring board 10 are connected are protected from external environmental conditions such as moisture.

Next, plural semiconductor elements 6 mounted on the main surface of the wiring board 10 are sealed in a body by resin. More specifically, the wiring board 10 is provided at a mold 14. Sealing resin 15 is supplied into a cavity where one of the main surfaces of the wiring board 10 is arranged so that sealing by resin is performed. See FIG. 3H.

Next, plural solder balls as outside connection terminals 16 are provided on another main surface of the wiring board 10. See FIG. 3I.

After that, the wiring board 10 and the sealing resin 15 are divided along dotted lines X-X' by the blade dicing method using the dicing saw 17 so that each unit has a part of the wiring board 10, one of the semiconductor elements 6 sealed by the sealing resin 15 on the main surface of the wiring board 10, the adhesive 11, and others. See FIG. 4J.

As a result of this, a semiconductor device 18 is formed where the semiconductor element 6 is flip chip mounted (mounted in a face-down manner) on the wiring board 10 and is sealed by the sealing resin 15. See FIG. 4K.

The following example has been suggested. That is, when a chip is to be die bonded by pushing a rear surface (lower surface) of the chip, held by suction on a contact collar, against a chip-mounting area of a multi-wiring board, a protective tape is previously applied on a main surface of the chip. See Japanese Laid-Open Patent Application Publication No. 2003-234359. In addition, the following example has been suggested. That is, a semiconductor device is provided with a polyimide substrate on top of which copper wiring is formed, conductive connecting plugs which are provided in the polyimide substrate and are connected to copper wiring, solder balls which are formed on the rear side of the polyimide substrate and are connected to the copper wiring through the connecting plugs, a semiconductor chip which is face-down bonded to the top of the polyimide substrate, gold bumps which are mounted on the semiconductor chip and are connected to the copper wiring, an anisotropic conductive film disposed between the semiconductor chip and the polyimide substrate and a protective film provided on the whole rear side of the semiconductor chip. See Japanese Laid-Open Patent Application Publication No. 2001-68603.

Furthermore, the following example has been suggested. That is, a semiconductor chip 1a is provided with a chip back protective layer bonded on its back side through an intermediary adhesive layer, and is mounted on a circuit board through intermediary solder bumps formed on the surface of the circuit board. The solder bumps are melted by heating to bond the semiconductor chip and the circuit board together, and an adhesive layer 5 is softened to cover the side of the semiconductor chip with the adhesive layer 5. See Japanese Laid-Open Patent Application Publication No. 2005-26311.

However, the above-discussed manufacturing method of the semiconductor device has the following problems.

In other words, in a step illustrated in FIG. 2G, the semiconductor element 6 is flip-chip mounted (mounted in a face-down manner) by using the bonding tool 9 so that the projection electrodes (bumps) 12 provided on the main surface of the semiconductor element 6 are connected to the electrodes 13 of the wiring board 10.

At this time, the adhesive 11 provided between the wiring board 10 and the semiconductor element 6 creeps up along a side surface of the semiconductor element 6. In addition, the adhesive 11 expands from the side surface of the semiconductor element 6 to a surface of the wiring board 10 situated in a periphery so that a so-called filet is formed. See FIG. 5.

While attracted or held by the bonding tool 9, the semiconductor element 6 is heated and pressed so as to be fixed to the wiring board 10. At this time, viscosity of the adhesive 11 on the wiring board 10 is decreased. In addition, due to surface tension of the adhesive 11, the adhesive 11 creeps up along the side surface of the semiconductor element 6 and expands to the surface of the wiring board 10 so that the filet is formed.

Such a filet is preferable in terms of improvement of reliability of connection for solidifying with great contacting force at the time of solidification of the adhesive 11.

However, if the amount of application of the adhesive 11 is too much, the adhesive 11 creeps up so as to extend beyond the thickness of the semiconductor element 6. As a result of this, as illustrated in FIG. 6, a part of the adhesive 11 comes in contact with a lower surface of the bonding tool 9. FIG. 6B is an expanded view of a part surrounded by a dotted line in FIG. 6A.

Since the bonding tool 9 is heated so as to have high temperature, the adhesive 11 which comes in contact with the lower surface of the bonding tool 9 is cured. As a result of this, as illustrated in FIG. 7, the adhesive 11 is adhered to the lower surface of the bonding tool 9 and remains.

As a result of this, flatness of the surface semiconductor element attracting surface of the bonding tool 9 is interrupted. Hence, when the semiconductor element 6 to be bonded next time is held for the bonding process, a bad connection of the semiconductor element 6 to the wiring board 10 may occur due to such as generation of holding error, uneven heating of the semiconductor element 6, or lack of increase of temperature of the part where the semiconductor element 6 and the wiring board 10 are connected.

In addition, the adhesive 11A which is adhered and solidified has a projection-shaped configuration. Accordingly, bonding loads are concentrated where the projection is the base point at the time of the bonding process so that a crack may be generated in the semiconductor element 6.

In addition, it is difficult to detect and remove the adhesive 11A. Furthermore, even if the adhesive can be removed, it is normal practice that a means for detecting the removal of the adhesive 11 is not provided in the bonding apparatus. Therefore, once the adhesive 11A is formed, bad semiconductor devices may be manufactured without notification of this situation.

As the thickness of the semiconductor element 6 is less, adhesion of the adhesive 11 to the bonding tool 9 due to creeping up of the adhesive 11 may be easily generated. Hence, accompanying the demand for thin sizes of the semiconductor devices, such a problem may be further increased.

In order to solve such a problem, it is necessary to prevent the adhesive 11 from being adhered to the bonding tool 9.

This problem may be avoided by reducing the amount of application of the adhesive 11 to the wiring board 10. However, as a result of this, reliability of the adhesion between the semiconductor element 6 and the wiring board 10 may be degraded so that the reliability of the semiconductor device may be also degraded.

In addition, a function for detecting that the adhesive 11 is adhered to the bonding tool 9 may be added to the bonding apparatus. However, cost for adding such a function is incurred. In addition, manufacturing process capabilities may be degraded due to the detection process, so that increase of the manufacturing process may occur.

SUMMARY

According to an aspect of the invention, a manufacturing method of a semiconductor device includes providing an adhesive on a supporting board, the supporting board being where a semiconductor element is to be mounted; providing a member configured to block flow of the adhesive on a first main surface of the semiconductor element, the semiconductor element having a second main surface where an outside connection terminal is provided; and mounting the semiconductor element on a part of the supporting board where the adhesive is provided by pressing the semiconductor element via the member.

Additional objects and advantages of the embodiments are set forth in part in the description which follows, and in part will become obvious from the description, or may be learned by practice of the invention.

The object and advantages of the invention may be realized and attained by means of the elements and combinations particularly pointed out in the appended claims.

It is to be understood that both the foregoing general description and the following detailed description are exemplary and explanatory and are not restrictive of the invention as claimed.

BRIEF DESCRIPTION OF THE DRAWINGS

FIG. 3 is a cross-sectional view of the manufacturing method of the semiconductor device of the related art;

FIG. 20 is a main part cross-sectional view of the manufacturing method of the semiconductor device of the first embodiment;

FIG. 21 is a main part cross-sectional view of the manufacturing method of the semiconductor device of the first embodiment;

FIG. 22 is a main part cross-sectional view of the manufacturing method of the semiconductor device of the first embodiment;

DETAILED DESCRIPTION OF THE PREFERRED EMBODIMENTS

Preferred embodiments of the present invention will be explained with reference to accompanying drawings.

In the following description, manufacturing methods of semiconductor devices of two embodiments are discussed in details.

First Embodiment

A first embodiment is discussed with reference to FIG. 8 through FIG. 23. In FIG. 8 through FIG. 12, FIG. 14, FIG. 15, and FIG. 17 through FIG. 19, (b) is a main part expanded cross-sectional view of (a).

A semiconductor substrate (wafer) 21 having a main surface is prepared where a so-called wafer process is applied so that plural semiconductor elements (LSI elements) are formed. A polishing process is applied, if necessary, to another main surface (rear surface) of the semiconductor substrate 21 so that the thickness of the semiconductor substrate 21 is decreased.

An ultraviolet (UV) curing type dicing tape 22 is adhered on a rear surface (electronic circuit non-forming surface) of the semiconductor substrate 21. The semiconductor substrate 21 is fixed to a wafer ring (frame) 23 via the dicing tape 22. See FIG. 8A.

Figure 1A:
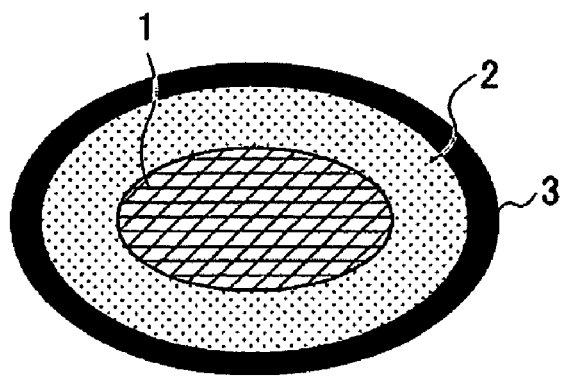
FIG. 1 is a perspective view showing a manufacturing method of a semiconductor device of a related art case.
Figure 1B:
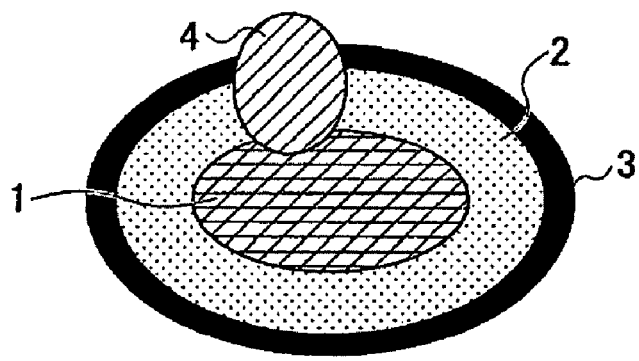
Figure 1C:
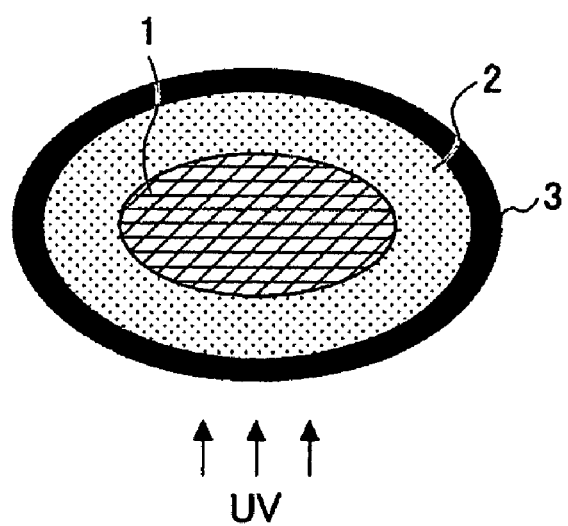
Figure 2D:
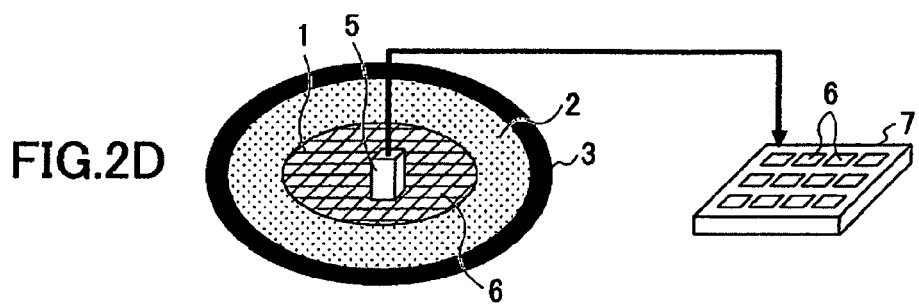
FIG. 2 is a perspective view showing the manufacturing method of the semiconductor device of the related art.
Figure 2E:
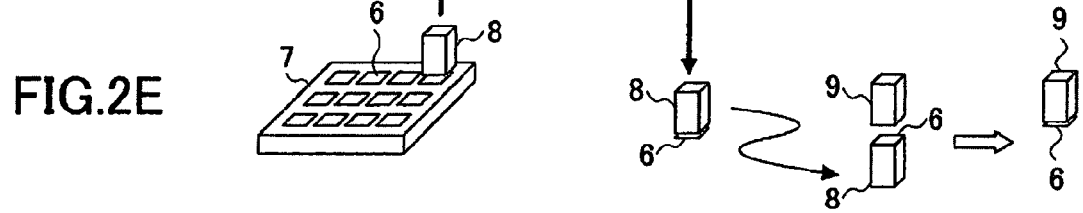
Figure 2F:
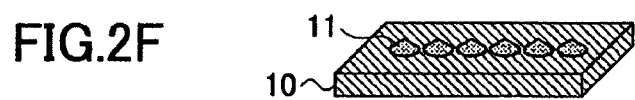
Figure 2G:
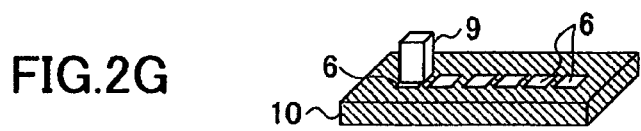
Figure 4J:
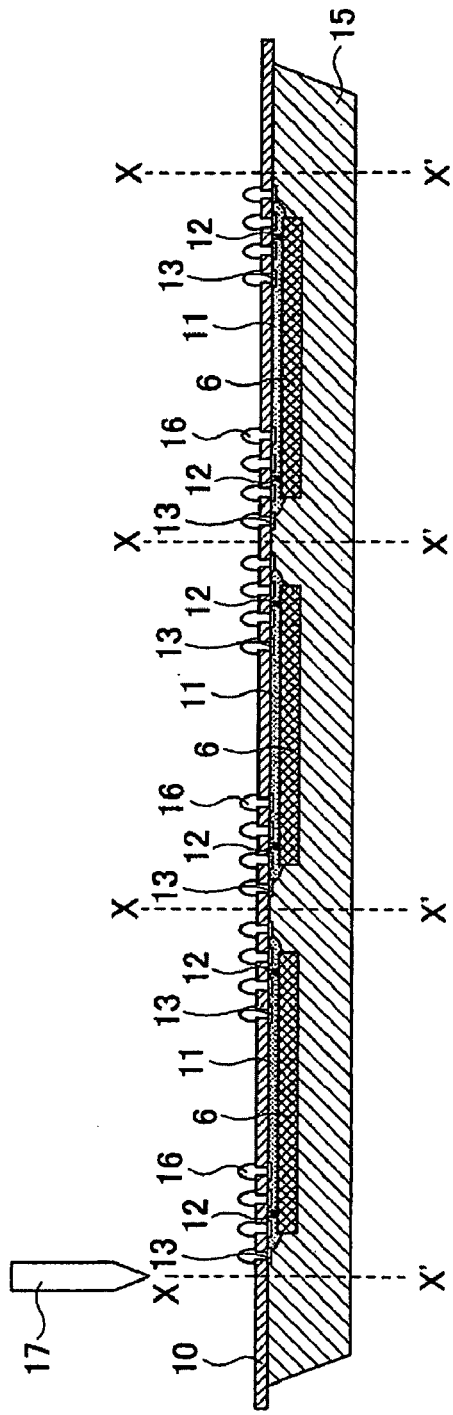
FIG. 4 is a cross-sectional view of the manufacturing method of the semiconductor device of the related art.
Figure 4K:
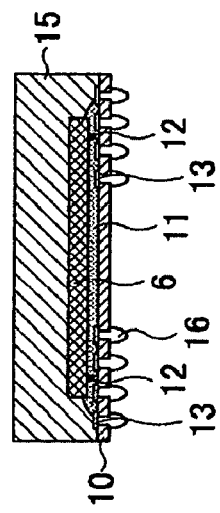
Figure 5:
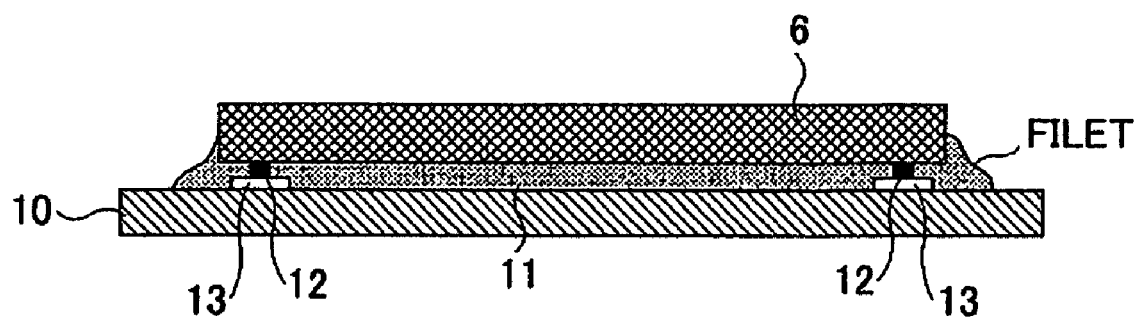
FIG. 5 is a side view showing problems of the manufacturing method of the semiconductor device of the related art.
Figure 6A:
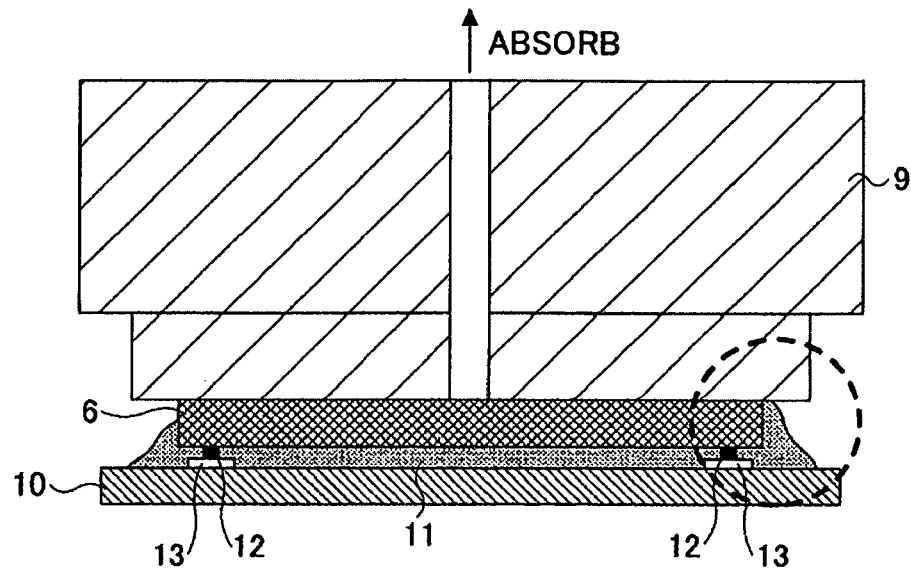
FIG. 6 is a side view showing the problems of the manufacturing method of the semiconductor device of the related art.
Figure 6B:
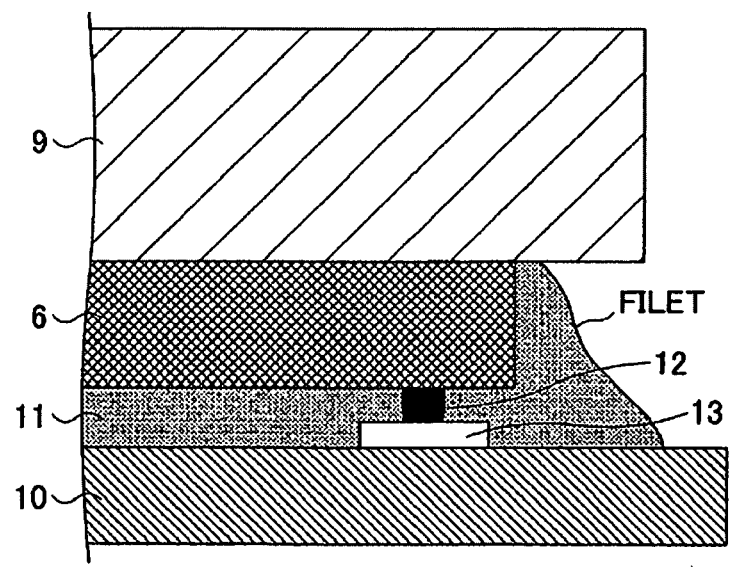
Figure 7:
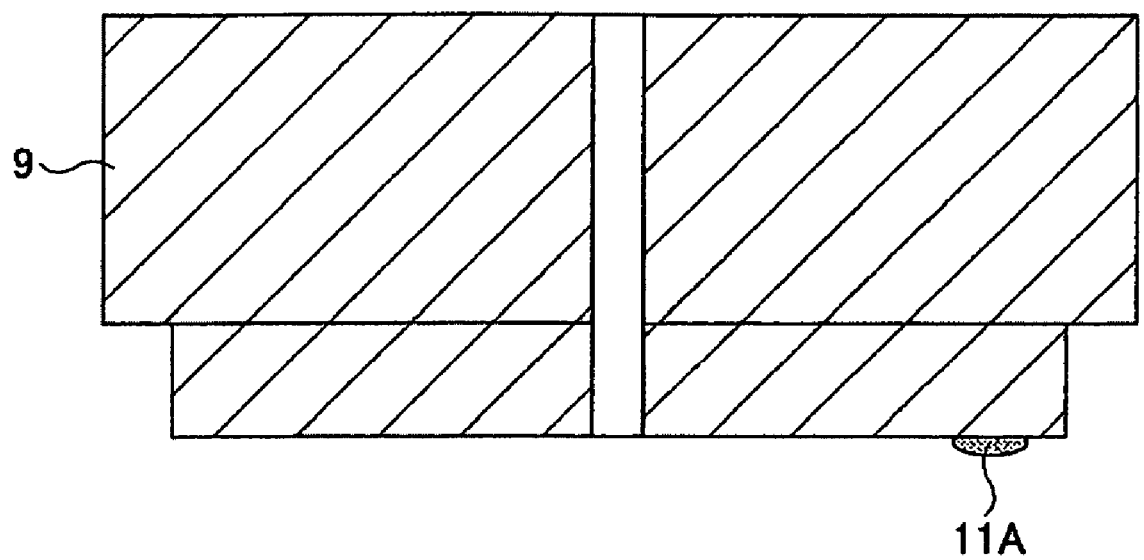
FIG. 7 is a side view showing the problems of the manufacturing method of the semiconductor device of the related art.
Figure 8A:
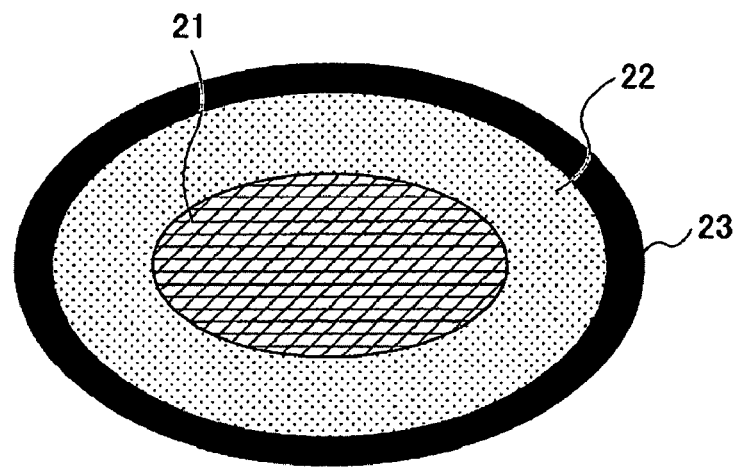
FIG. 8 is a perspective view and a main part cross-sectional view of a manufacturing method of a semiconductor device of a first embodiment.
Figure 8B:
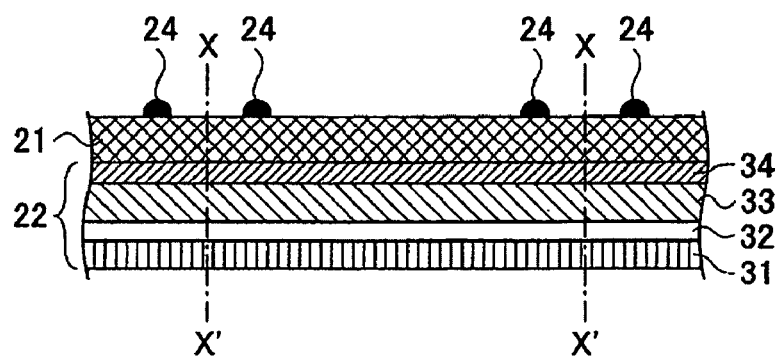

The semiconductor substrate 21 adhered on the dicing tape 22 is illustrated in FIG. 8B. On another main surface (semiconductor element forming surface) of the semiconductor substrate 21, projection electrodes (bumps) 24 as outside connection terminals are provided in each area where semiconductor elements are to be formed. In FIG. 8B, one dotted line X-X' indicates a boundary part of adjacent semiconductor elements.

On the other hand, the dicing tape 22 has a four-layer structure. In other words, a first adhesive layer 32 which is an ultraviolet curing type, a protection tape base material 33, and a second adhesive layer 34 which is an ultraviolet curing type are stacked on a dicing tape base material 31 in this order.

As a material of the dicing tape base material 31, for example, polyethylene terephthalate (PET) or polyolefin (PO), or the like can be used. However, the material of the dicing tape base material 31 is not limited to these materials. In addition, there is no limitation to the thickness of the dicing tape base material 31. The thickness of dicing tape base material 31 may be, for example, approximately 50 μm through approximately 100 μm.

In addition, heat resistance properties are required of the protection tape base material 33 because the protection tape base material 33 is heated in the following bonding step. A polyethylene terephthalate group material is proper as the material of the protection tape base material 33, because even if the adhesive comes in contact with the protection tape base material 33, the adhesive may not be adhered or solidified. In addition, there is no limitation to the thickness of the protection tape base material 33. The thickness of the protection tape base material 33 may be, for example, approximately 10 μm through approximately 30 μm.

On the other hand, as the first adhesive layer 32 and the second adhesive layer 34, so-called ultraviolet (UV) curing type adhesive layers such as an acrylic ultraviolet (UV) curing type can be applied. However, the material of the first adhesive layer 32 and the second adhesive layer 34 is not limited to the above-mentioned material. In addition, there is no limitation to the thickness of the first adhesive layer 32 and the second adhesive layer 34. The thickness of first adhesive layer 32 and the second adhesive layer 34 may be, for example, approximately 20 µm through approximately 50 µm.

An amount (fluence) of irradiation of ultraviolet (UV light) necessary to start the curing of the second adhesive layer 34 is greater than that of the first adhesive later 32. For example, when the amount of irradiation of ultraviolet (UV light) necessary for starting the curing of the first adhesive layer 32 is approximately 100 mJ/cm$^2$, the amount of irradiation of ultraviolet (UV light) necessary for starting the curing of the second adhesive layer 34 is approximately 500 mJ/cm$^2$.

By changing the mixture of materials forming the adhesive, it is possible to change the amount of irradiation of ultraviolet (UV light) necessary to start the curing of the adhesive layer.

The heat resistance properties are required of the second adhesive layer 34 because the second adhesive layer 34, as well as the dicing tape base material 31, is heated in the following bonding step.

Next, corresponding to a one-dotted line X-X' in FIG. 8B, the semiconductor substrate 21 is divided vertically and horizontally by a blade dicing method using a first dicing saw 25 so that each of the semiconductor elements 21A is cut off and separated from the semiconductor substrate 21. See FIG. 9. By this dicing, each of the semiconductor elements 21A having a rectangular-shaped plane configuration is cut off and separated from the semiconductor substrate 21.

At this time, the width (edge thickness) of the first dicing saw 25 may be, for example, equal to or greater than approximately 50 µm.

The first dicing saw 25 cuts the semiconductor substrate 21 and the second adhesive layer 34 so as to reach the upper surface of the protection base material 33. As a result of this, a groove (dicing groove) 26 configured to expose the protection tape base material 33 is formed.

Next, the protection tape base material 33 exposed in the dicing groove 26 by the dicing process and the first adhesive layer 32 situated under the protection tape base material 33 are cut in by the blase dicing method using a second dicing saw 27 and thereby a groove 28 is formed. See FIG. 10A and FIG. 10B.

Next, the width (edge thickness) of the second dicing saw 27 is less than that of the first dicing saw 25 and may be, for example, equal to or less than approximately 20 µm. In the dicing process, the second dicing saw 27 reaches the upper surface of the dicing tape base material 31.

As a result of this, a step by the groove 26 and the groove 28 is formed between the periphery of each of the semiconductor elements 21A and the dicing tape base material 31. See FIG. 10C.

In other words, the semiconductor substrate 21 and the second adhesive layer 34 are cut off and separated by the first dicing saw 25. The protection tape base material 33 and the first adhesive layer 32 are cut off and separated by the second dicing saw 27. A width B of the groove 28 formed in the protection tape base material 33 and the first adhesive layer 32 is smaller than a width A of the groove 26 formed in the semiconductor substrate 21 and the second adhesive layer 34. (B<A)

Therefore, in a case where a cutting process is performed under the conditions that the width of the first dicing saw 25 is approximately 50 µm and the width of the second dicing saw 27 is approximately 20 µm, the protection tape base material 33 remains at each of the semiconductor elements 21A so as to extend approximately 15 µm to outside of the semiconductor element 21A. In other words, the protection tape base material 33 having a size larger than the semiconductor element 21A is adhered to the semiconductor element 21A via the second adhesive layer 34.

The protection tape base material 33 extends to outside of the side surface of the semiconductor element 21A at all four sides of the semiconductor element 21A so as to have a rectangular-shaped plan view configuration.

By making the width (edge thickness) of the second dicing saw 27 further less than that of the first dicing saw 25, it is possible to make the difference between the width A of the groove 26 of the second adhesive layer 34 and the semiconductor substrate 21 and the width B of the groove 28 of the first adhesive layer 32 and the protection tape base material 33 greater.

As a result of this, the protection tape base material 33 having a size larger than the semiconductor element 21A can be provided on the rear surface of the semiconductor element 21A.

Next, ultraviolet (UV light) is applied from a lower surface side of the dicing tape base material 31, namely a surface opposite to a surface where the cut semiconductor substrate 21A is provided. See FIG. 11.

The amount of irradiation of the ultraviolet (UV light) is set whereby the curing of the first adhesive layer 32 starts while the curing of the second adhesive layer 34 does not start.

In other words, when the amount of irradiation of ultraviolet (UV) light necessary to start the curing of the first adhesive layer 32 is approximately 100 mJ/cm$^2$ and the amount of irradiation of ultraviolet (UV) light necessary to start the curing of the second adhesive layer 34 is approximately 500 mJ/cm$^2$, approximately 200 mJ/cm$^2$ of the ultraviolet (UV light) is irradiated.

As a result of this, only the first adhesive layer 32 is cured and the second adhesive layer 34 is not cured.

In other words, only the first adhesive layer 32 provided on the dicing tape base material 31 is cured so that the adhesive force is reduced, so that the protection tape base material 33 provided on the first adhesive layer 32 can be removed from the dicing tape base material 31.

After that, the cut semiconductor element 21A where the protection tape base material 33 is provided via the second adhesive layer 34 is removed from the dicing tape base material 31 so as to be received in a tray 41. See FIG. 12.

In other words, plural semiconductor elements 21A supported on the dicing tape base material 31 and the protection tape base material 33 are provided on a table (not illustrated). A vacuum suction hole is provided at the table. The vacuum suction hole is connected to a vacuum apparatus. The dicing tape base material 31 is attracted and fixed on the table via the vacuum suction hole.

In this state, thrust-up pins 42 are raised up from underneath the dicing tape base material 31 so as to pierce the dicing tape base material 31 and the first adhesive layer 32 so that a single semiconductor element 21A is removed from the dicing tape base material 31.

Since the adhesive force of the first adhesive layer 32 is reduced, the semiconductor element 21A and the protection tape base material 33 positioned on the first adhesive layer 32 are separated from the dicing tape base material 31 in a body.

On the other hand, corresponding to the raising-up of the thrust-up pins 42, an absorption tool 43 is arranged above the semiconductor element 21A. The absorption tool 43 takes suction on and holds the semiconductor element 21A which is pushed up. The absorption tool 43 delivers the semiconductor element 21A so that the semiconductor element 21A is received in the tray 41.

As a result of this, the protection tape base material 33 having a size larger than the semiconductor element 21A is provided, via the second adhesive layer 34, to the rear surface of the semiconductor element 21A received in the tray 24.

Next, the semiconductor element 21A received in the tray 41 is taken out by using a pick-up tool 44. Then, the pick-up tool 44 is inverted up and down so as to deliver the semiconductor element 21A to a bonding tool 45 waiting above. See FIG. 13.

As a result of this, the bonding tool 45 adheres the protection tape base material 33 provided on the rear surface of the semiconductor element 21A via the second adhesive 34 so as to hold the semiconductor element 21A.

On the other hand, an adhesive 52 made of thermosetting resin or the like such as paste epoxy group resin is applied to a portion of an upper surface of a wiring board 51 where the semiconductor elements 21A are mounted and fixed as shown in the following step. See FIG. 14.

Figure 14A:
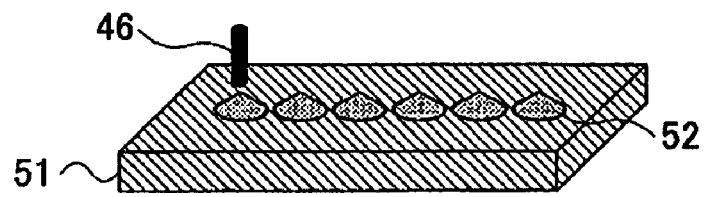
FIG. 14 is a perspective view and a main part cross-sectional view of the manufacturing method of the semiconductor device of the first embodiment.
Figure 14B:
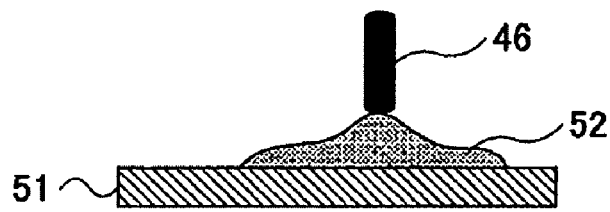
Figure 15A:
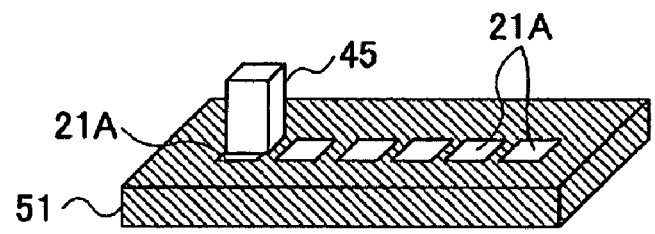
FIG. 15 is a perspective view and a main part cross-sectional view of the manufacturing method of the semiconductor device of the first embodiment.
Figure 15B:
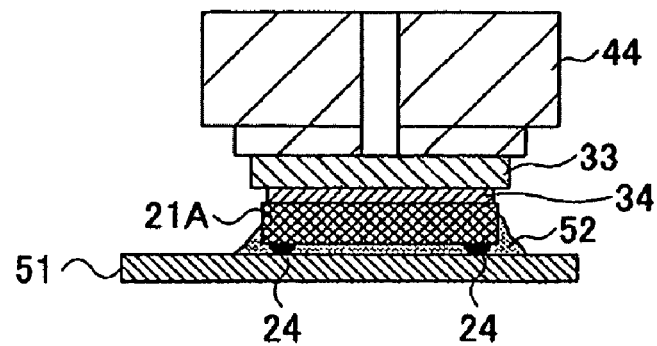
Figure 16:
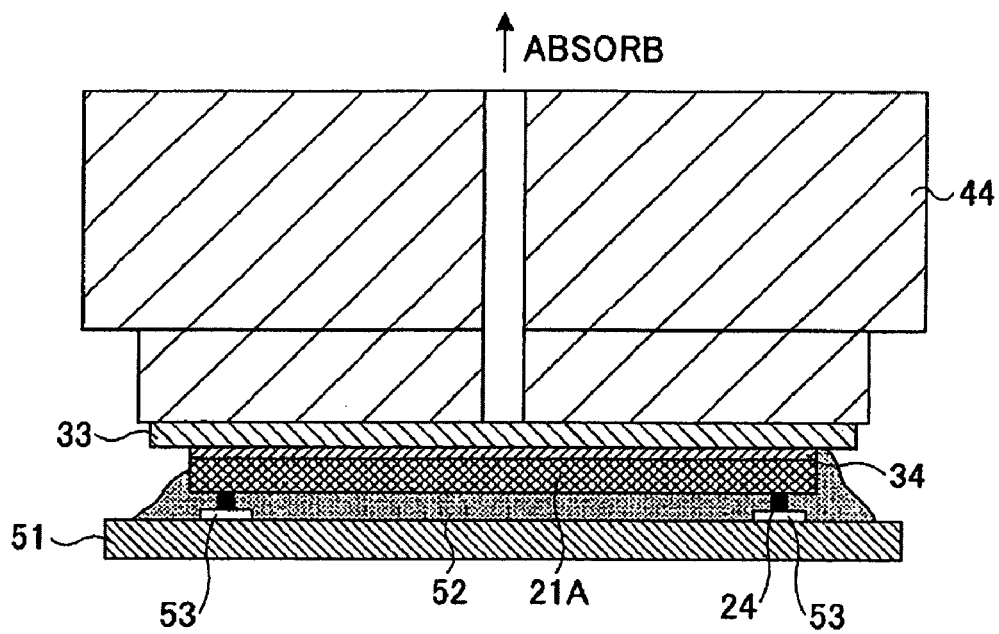
FIG. 16 is a main part cross-sectional view of the manufacturing method of the semiconductor device of the first embodiment.
Figure 17A:
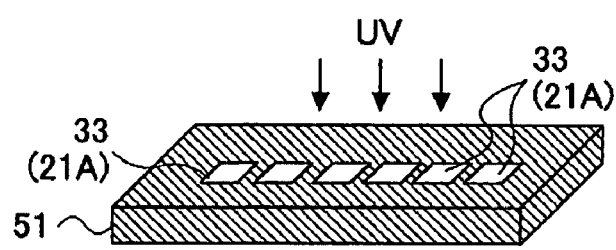
FIG. 17 is a perspective view and a main part cross-sectional view of the manufacturing method of the semiconductor device of the first embodiment.
Figure 17B:
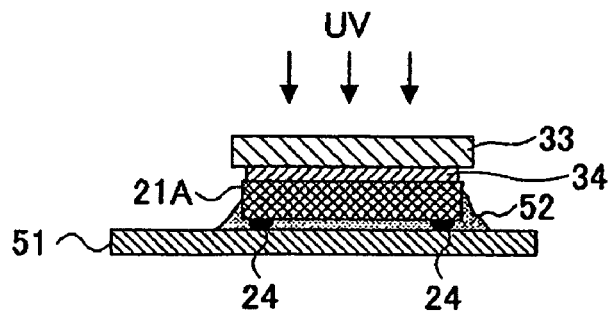

As illustrated in FIG. 14, in a case where the wiring board 51 has a large size so that plural semiconductor elements 21A are provided on the wiring board 51, the adhesive 52 is selectively applied to a part where each of the semiconductor elements 21A is to be provided.

Next, by using an image processing apparatus (not illustrated), the semiconductor element 21A and the wiring board 51 are positioned. The semiconductor element 21A is flip-chip mounted (mounted in a face-down manner) on the wiring board 51 while heating and pressing are applied by using the bonding tool 45. See FIG. 15.

At this time, the adhesive 52 is cured by heating so that the adhesion of the semiconductor elements 21A and the wiring board 51 is strengthened and parts where the semiconductor elements 21A and the wiring board 51 are connected are protected from elements of the external environment such as moisture.

At the time of flip-chip mounting (mounting in a face-down manner), the projection electrodes (bumps) 24 provided on the lower surface of the semiconductor element 21A are connected to electrodes 53 of the wiring board 51 where the adhesive 52 is applied. If the amount of application of the adhesive 52 is too much, the adhesive 52 creeps up on the side surface of the semiconductor element 21A so as to be beyond the thickness of the semiconductor element 21A. See FIG. 16.

In this embodiment, the protection tape base material 33 having a size larger than the semiconductor element 21A is provided, via the second adhesive layer 34, between the rear surface of the semiconductor element 21A and the bonding tool 45. In other words, the protection tape base material 33 extends to outside of the side surface of the semiconductor element 21A at all four sides of the semiconductor element 21A.

Because of this, the flow of the adhesive 52 creeping up on the side surface of the semiconductor element 21A is blocked by the protection tape base material 33 and therefore the adhesive 52 does not reach the bonding tool 45.

Therefore, it is possible to continuously provide the semiconductor elements 21A on the large size wiring board 51 without adhesion of the adhesive 52 to the bonding tool 45.

Figure 12A:
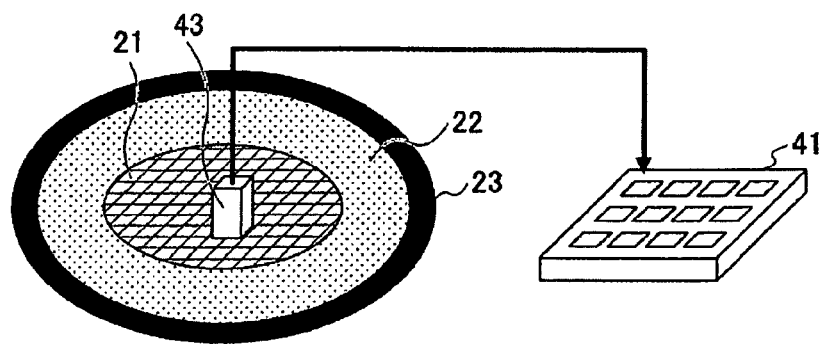
FIG. 12 is a perspective view and a main part cross-sectional view of the manufacturing method of the semiconductor device of the first embodiment.
Figure 12B:
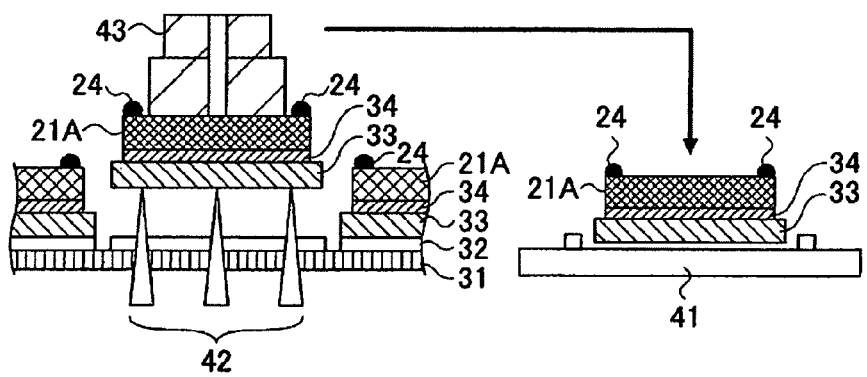
Figure 13:
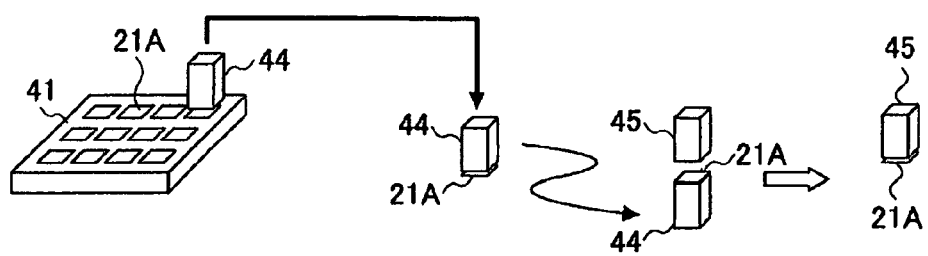
FIG. 13 is a perspective view of the manufacturing method of the semiconductor device of the first embodiment.

In the step illustrated in FIG. 12, after the semiconductor element 21A is removed from the dicing tape base material 30, the semiconductor element 21A is received in the tray 41. However, after the semiconductor element 21A is removed from the dicing tape base material 30, without reception of the semiconductor element 21A in the tray 41, it is possible to invert the adsorption tool 43 up and down and deliver the semiconductor element 21A to the bonding tool 45 waiting above so that the semiconductor element 21A is adhered to the wiring board 51.

Next, ultraviolet (UV) light is applied from an upper part of the semiconductor elements 21A to the wiring board 15 where plural semiconductor elements 21A are provided. See FIG. 17.

The amount of irradiation of the ultraviolet (UV light) is determined so as to start the curing of the second adhesive layer 34. For example, when the amount of irradiation of ultraviolet (UV light) necessary to start the curing of the second adhesive layer 34 is approximately 500 mJ/cm$^2$, approximately 600 mJ/cm$^2$ of the ultraviolet (UV light) is irradiated.

As a result of this, the second adhesion layer 34 provided between the rear surface of the semiconductor element 21A and the protection tape base material 33 is cured so that the adhesion force is reduced. The protection tape base material 33 can be removed from the rear surface of the semiconductor element 21A.

Next, a continuous removing tape 47 is adhered on the protection tape base material 33 where plural semiconductor elements 21A are provided. The removing tape 47 is pulled so that the protection tape base material 33 is removed from the rear surfaces of the semiconductor elements 21A. See FIG. 18.

Figure 18A:
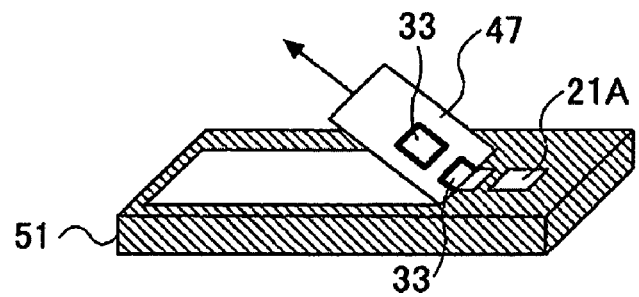
FIG. 18 is a perspective view and a main part cross-sectional view of the manufacturing method of the semiconductor device of the first embodiment.
Figure 18B:
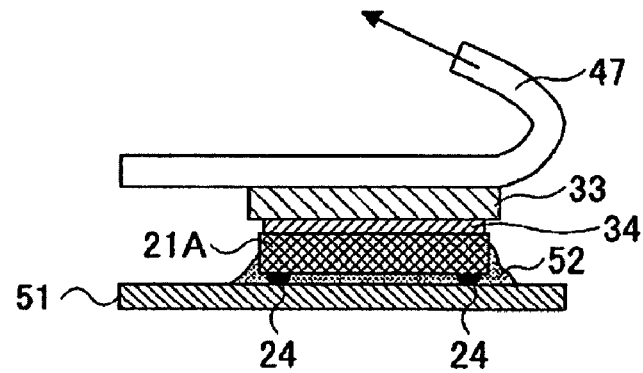

In other words, the removing tape 47 is pulled in the direction of an arrow in FIG. 18 so that the protection tape base material 33 adhered to the semiconductor elements 21A is removed.

There is no limitation to a material, thickness, or the like of the removing tape 47. However, adhesion capabilities whereby the protection tape base material 33 can be removed are required of the removing tape 47.

In this step, the protection tape base material 33 is removed from the rear surfaces of plural semiconductor elements 21A provided on the wiring board 51. See FIG. 19.

Next, the semiconductor elements 21A mounted and fixed on the main surface of the wiring board 51 are sealed by resin in a body. The wiring board is provided to a mold 61. Sealing resin 62 is supplied into a cavity where one of the main surfaces of the wiring board 51 is arranged so that sealing by resin is performed. See FIG. 20.

Next, plural solder balls as outside connection terminals 54 are provided on another main surface of the wiring board 51, corresponding to the electrodes 53 of the wiring board 51. See FIG. 21.

After that, the wiring board 51 and the sealing resin 62 are divided along dotted lines X-X' by the blade dicing method using a dicing saw 29 so that each unit has a part of the wiring board 51, one of the semiconductor elements 21A sealed by the sealing resin 62 on the main surface of the wiring board 51, the adhesive 52, and others. See FIG. 22.

As a result of this, the semiconductor element 21A is flip-chip mounted (mounted in the face-down manner) on the wiring board 51 so that a semiconductor device 71 sealed by the sealing resin 62 is formed. See FIG. 23. The semiconductor device 71 may be called a BGA (ball grid array) type semiconductor device.

Thus, according to the first embodiment, even if the adhesive 52 applied on the wiring board 51 in advance creeps up on the side surface of the semiconductor element 21A when the semiconductor element 21A is fixed on the wiring board 51 by using the bonding tool 45, it is possible to block the adhesive 52 from reaching the bonding tool 45 by the protection tape base material 33 having an area larger than the semiconductor element 21A and provided on the rear surface of the semiconductor element 21A.

Accordingly, it is possible to apply a sufficient amount of the adhesive 52 without decreasing the amount of application of the adhesive 52 to the wiring board 51. Therefore, it is possible to realize adhesion of the semiconductor element 21A to the wiring board 51 with high reliability.

Furthermore, it is not necessary to add a function for detecting adhesion of the adhesive 52 to the bonding tool 45 to the apparatus configured to operate the bonding tool 45.

Second Embodiment

Next, a second embodiment is discussed with reference to FIG. 24 through FIG. 34. FIG. 25 and FIG. 35 through FIG. 37 are main part expanded cross-sectional views. In the second embodiment, parts that are the same as the parts discussed in the first embodiment are given the same reference numerals, and explanation thereof is omitted.

A semiconductor substrate (wafer) 21 is prepared having a main surface where a so-called wafer process is applied so that plural semiconductor elements (LSI elements) are formed. A polishing process is applied, if necessary, to another main surface (rear surface) of the semiconductor substrate 21 so that the thickness of the semiconductor substrate 21 is decreased.

A rear surface (electronic circuit non-forming surface) of the semiconductor substrate 21 is adhered to a tape 81, and the tape 81 and the semiconductor substrate 21 is fixed to a wafer ring (frame) 23. See FIG. 24.

Figure 25:
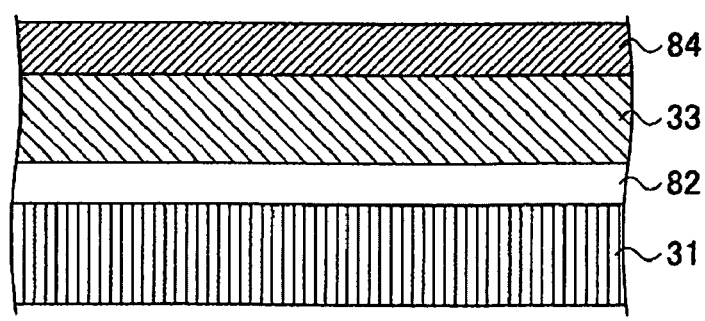
FIG. 25 is a main part cross-sectional view of the manufacturing method of the semiconductor device of the second embodiment.
Figure 26:
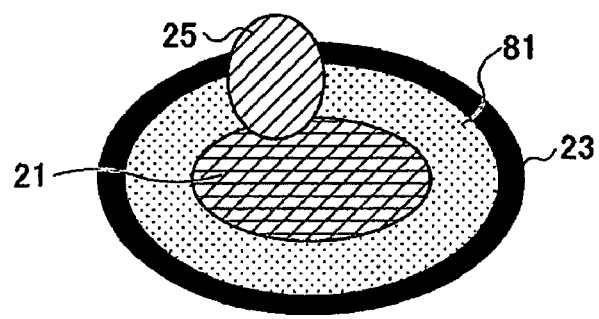
FIG. 26 is a perspective view of the manufacturing method of the semiconductor device of the second embodiment.
Figure 27:
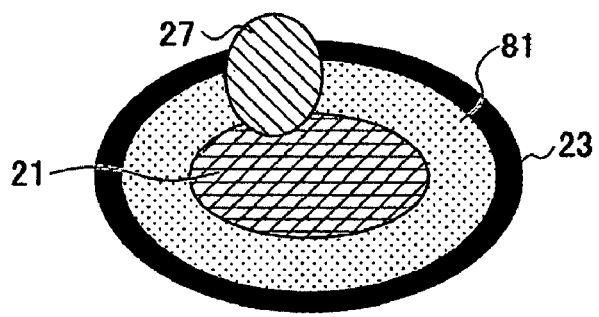
FIG. 27 is a perspective view of the manufacturing method of the semiconductor device of the second embodiment.
Figure 28:
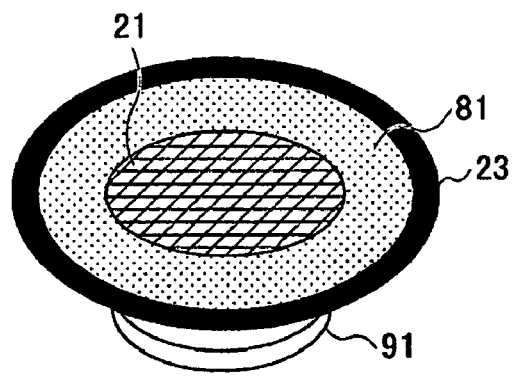
FIG. 28 is a perspective view of the manufacturing method of the semiconductor device of the second embodiment.
Figure 29:
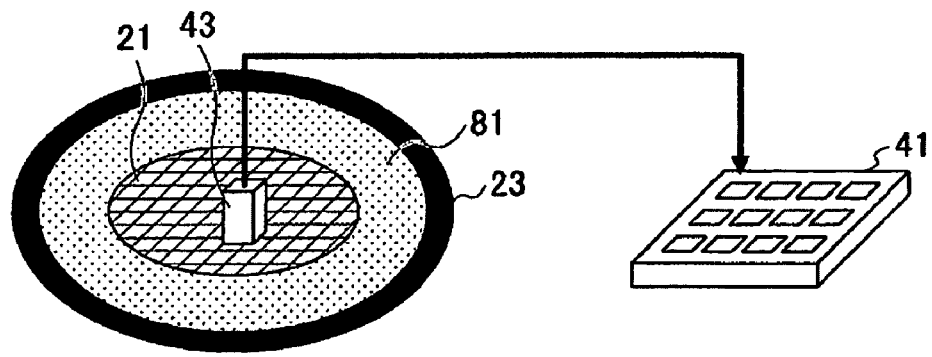
FIG. 29 is a perspective view of the manufacturing method of the semiconductor device of the second embodiment.
Figure 30:
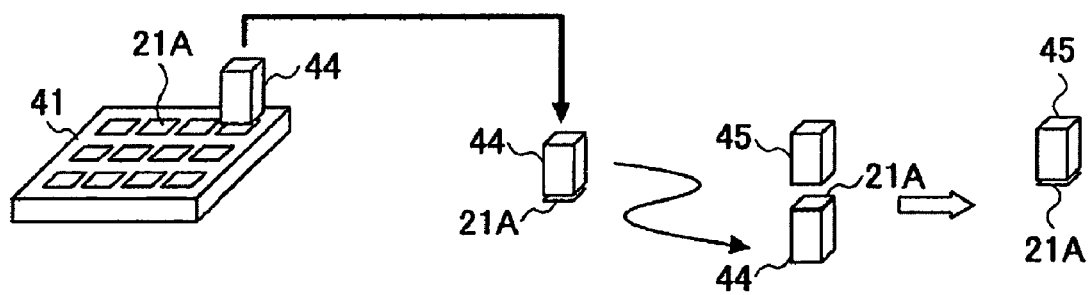
FIG. 30 is a perspective view of the manufacturing method of the semiconductor device of the second embodiment.

The dicing tape 81 has a four-layer structure as illustrated in FIG. 25. In other words, a first adhesive layer 82 which is a thermally foamed type, a protection tape base material 33, and a second adhesive layer 84 which is a thermally foamed type are stacked on a dicing tape base material 31 in this order.

As a material of the dicing tape base material 31, for example, polyethylene terephthalate (PET) or polyolefin (PO), or the like can be used. However, the material of the dicing tape base material 31 is not limited to these materials. In addition, there is no limitation to the thickness of the dicing tape base material 31. The thickness of dicing tape base material 31 may be, for example, approximately 50 µm through approximately 100 µm.

In addition, heat resistance properties are required of the protection tape base material 33 because the protection tape base material 33 is heated in the following bonding step. A polyethylene terephthalate group material is proper as the material of the protection tape base material 33, because even if the adhesive comes in contact with the protection tape base material 33, the adhesive may not be adhered or solidified. In addition, there is no limitation to the thickness of the protection tape base material 33. The thickness of the protection tape base material 33 may be, for example, approximately 10 µm through approximately 30 µm.

On the other hand, the first adhesive layer 82 and the second adhesive layer 84 are thermally foamed adhesive layers. These layers 82 and 84 are foamed by heat so that the adhesion force is reduced. There is no limitation to materials of the first adhesive layer 82 and the second adhesive layer 84. For example, a thermal release sheet "REVALPHA" manufactured by Nitto Denko Corporation can be used as the materials of the first adhesive layer 82 and the second adhesive layer 84. There is no limitation of the thickness of the adhesive layers 82 and 84. The thickness of first adhesive layer 82 and the second adhesive layer 84 may be, for example, approximately 20 µm through approximately 50 µm.

The temperature at which foaming of the second adhesive layer 84 starts is higher than the temperature at which foaming of the first adhesive layer 82 starts. For example, the temperature at which foaming of the first adhesive layer 82 starts is approximately 90° C. The temperature at which foaming of the second adhesive layer 84 starts is approximately 150° C.

By changing the mixture of materials forming the adhesive, it is possible to change the temperature at which foaming of the adhesive layer starts.

Figure 9A:
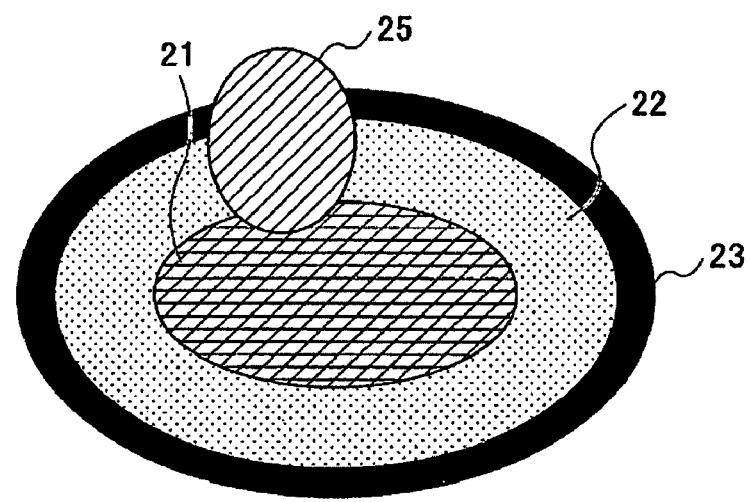
FIG. 9 is a perspective view and a main part cross-sectional view of the manufacturing method of the semiconductor device of the first embodiment.
Figure 9B:
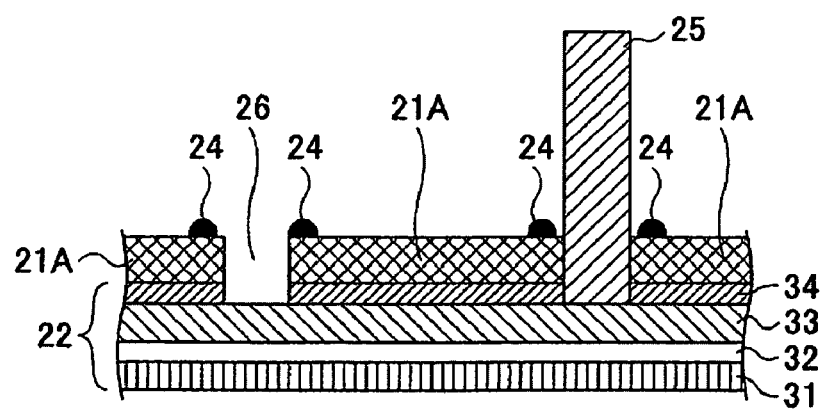
Figure 10A:
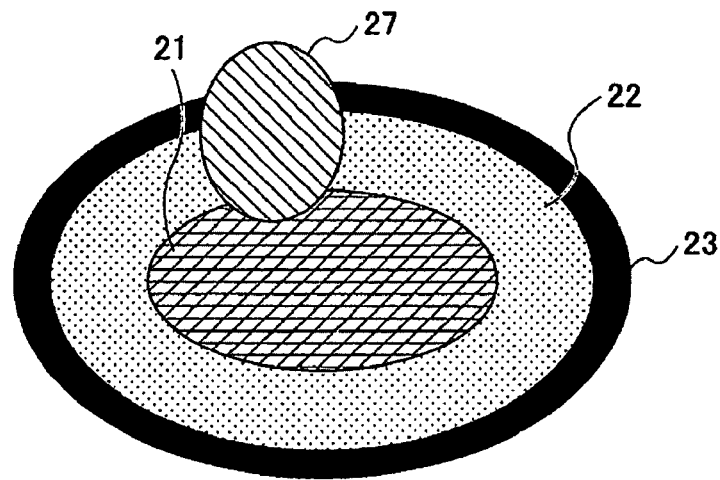
FIG. 10 is a perspective view and a main part cross-sectional view of the manufacturing method of the semiconductor device of the first embodiment.
Figure 10B:
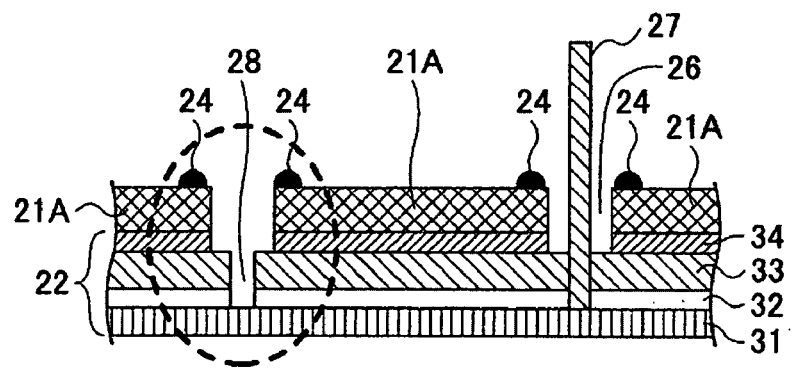
Figure 10C:
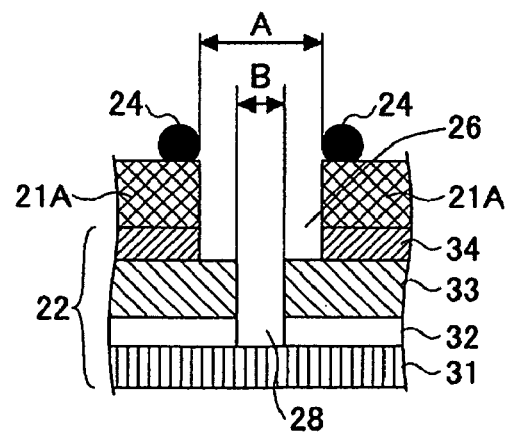
Figure 11A:
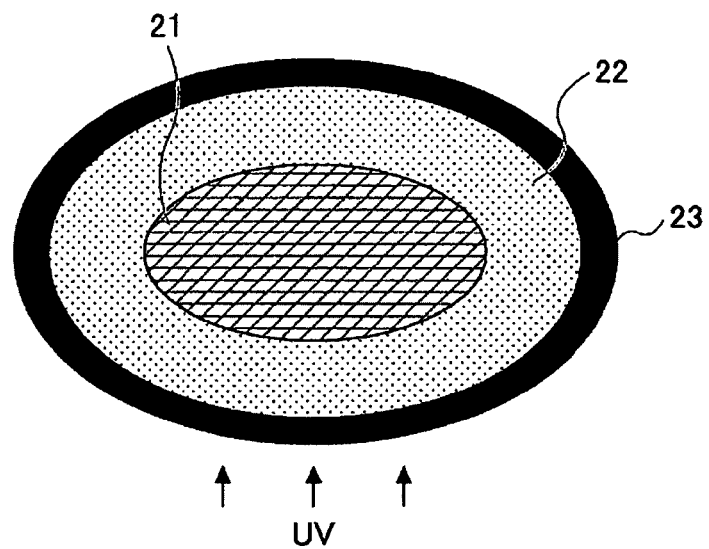
FIG. 11 is a perspective view and a main part cross-sectional view of the manufacturing method of the semiconductor device of the first embodiment.
Figure 11B:
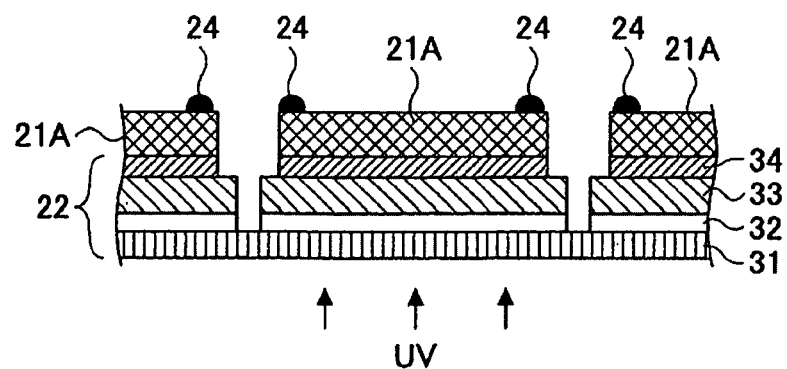

In the next step, as well as the step illustrated in FIG. 9 in the first embodiment, the semiconductor substrate 21 is divided vertically and horizontally by a blade dicing method using a first dicing saw 25 so that each of the semiconductor elements 21A is cut off and separated from the semiconductor substrate 21. See FIG. 26.

At this time, the width (edge thickness) of the first dicing saw 25 may be, for example, equal to or greater than approximately 50 µm. The first dicing saw 25 cuts the semiconductor substrate 21 and the second adhesive layer 84 so as to reach the upper surface of the protection base material 33. As a result of this, a groove (dicing groove) 26 configured to expose the protection tape base material 33 is formed.

In next step, as well as the step illustrated in FIG. 10 in the first embodiment, the protection tape base material 33 exposed in the dicing groove 26 by the dicing process and the first adhesive layer 82 situated under the protection tape base material 33 are cut in by the blase dicing method using the second dicing saw 27. See FIG. 27.

Next, the width (edge thickness) of the second dicing saw 27 is less than that of the first dicing saw 25 and may be, for example, equal to or less than approximately 20 µm.

In the dicing process, the second dicing saw 27 reaches the upper surface of the dicing tape base material 31. As a result of this, a groove step is formed in the semiconductor substrate 21 and the tape 81 (not illustrated).

In other words, the semiconductor substrate 21 and the second adhesive layer 84 are cut off and separated by the first dicing saw 25. The protection tape base material 33 and the first adhesive layer 82 are cut off and separated by the second dicing saw 27. A width B of the cutting formed in the protection tape base material 33 and the first adhesive layer 82 is smaller than a width A of the cutting formed in the semiconductor substrate 21 and the second adhesive layer 84. (B<A)

By making the width (edge thickness) of the second dicing saw 27 further less than that of the first dicing saw 25, it is possible to make the difference between the width A of the cutting of the second adhesive layer 34 and the semiconductor substrate 21 and the width B of the cutting of the first adhesive layer 32 and protection tape base material 33 greater.

As a result of this, the protection tape base material 33 having a size larger than the semiconductor element 21A can be provided on the rear surface of the semiconductor element 21A via the second adhesive layer 84.

Next, the wafer ring 23 is provided on a heater block 91 so that the dicing tape base material 31 is heated from the lower surface side of the dicing tape base material 31.

At this time, heating temperature is set whereby the first adhesive layer 82 starts foaming while the second adhesive layer 84 does not start foaming.

In other words, when the temperature at which the foaming of the first adhesive layer 82 starts is approximately 90° C. and the temperature at which the foaming of the second adhesive layer 84 starts is approximately 150° C., the temperature of the heater block 91 is set approximately 100° C.

and the heater block 91 is pushed to the lower surface of the dicing tape base material 31 for approximately 5 seconds to approximately 10 seconds.

As a result of this, only the first adhesive layer 82 is foamed and the second adhesive layer 84 is not foamed.

In other words, only the first adhesive layer 82 provided on the dicing tape base material 31 is foamed so that the adhesive force is reduced, so that the protection tape base material 33 provided on the first adhesive layer 82 can be removed from the dicing tape base material 31.

Heating by the heater block 91 having substantially the same contact area as the semiconductor substrate 21 in a body like this example or heating with a semiconductor element unit by using the heater block having substantially the same contact area as the cut semiconductor element 21A can be selected for such a heating process if necessary.

After that, the cut semiconductor element 21A where the protection tape base material 33 is provided via the second adhesive layer 84 is removed from the dicing tape base material 31 so as to be received in the tray 41. See FIG. 29.

In other words, plural semiconductor elements 21A each supported on the dicing tape base material 31 and the protection tape base material 33 are provided on a table (not illustrated).

A vacuum suction hole is provided at the table. The vacuum suction hole is connected to a vacuum apparatus. The dicing tape base material 31 is attracted to and fixed on the table via the vacuum suction hole.

In this state thrust-up pins 42 are raised from underneath the dicing tape base material 31 so as to pierce the dicing tape base material 31 and the first adhesive layer 82 so that a single semiconductor element 21A is removed from the dicing tape base material 31.

Since the adhesive force of the first adhesive layer 82 is reduced, the semiconductor element 21A and the protection tape base material 33 positioned on the first adhesive layer 82 are separated from the dicing tape base material 31 in a body.

On the other hand, corresponding to raising-up of the thrust-up pins 42, the absorption tool 43 is arranged above the semiconductor element 21A. The absorption tool 43 takes suction on and holds the semiconductor element 21A which is pushed up. The absorption tool 43 delivers the semiconductor element 21A so that the semiconductor element is received in the tray 41.

As a result of this, the protection tape base material 33 having a size larger than the semiconductor element 21A is provided, via the second adhesive layer 84, to the rear surface of the semiconductor element 21A received in the tray 24.

Next, the semiconductor element 21A received in the tray 41 is taken out by using the pick-up tool 44. Then, the pick-up tool 44 is inverted up and down so as to deliver the semiconductor element 21A to the bonding tool 45 waiting above. See FIG. 30.

As a result of this, the bonding tool 45 adheres the protection tape base material 33 provided on the rear surface of the semiconductor element 21A via the second adhesive 84 so as to hold the semiconductor element 21A.

On the other hand, an adhesive 52 made of thermosetting resin or the like such as paste epoxy group resin is applied to a portion of an upper surface of the wiring board 51 where the semiconductor element 21A is mounted and fixed in the following step. See FIG. 31.

Figure 31:
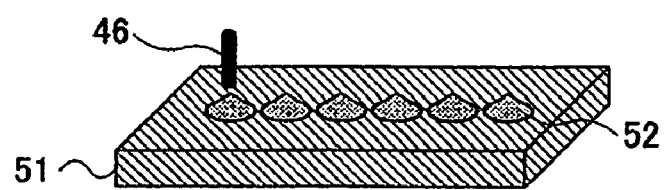
FIG. 31 is a perspective view of the manufacturing method of the semiconductor device of the second embodiment.

As illustrated in FIG. 31, in a case where the wiring board 51 has a large size so that plural semiconductor elements 21A are provided on the wiring board 51, the adhesive 52 is selectively applied to a part where each of the semiconductor elements 21A is to be provided.

Next, by using an image processing apparatus (not illustrated), the semiconductor element 21A and the wiring board 51 are positioned. The semiconductor element 21A is flip-chip mounted (mounted in a face-down manner) on the wiring board 51 while heating and pressing are applied by using the bonding tool 45. See FIG. 32.

At this time, the adhesive 52 is cured by heating so that the adhesion of the semiconductor elements 21A and the wiring board 51 is strengthened and parts where the semiconductor elements 21A and the wiring board 51 are connected are protected from effects of the external environment such as moisture.

At the time of flip-chip mounting (mounting in a face-down manner), the projection electrodes (bumps) 24 provided on the lower surface of the semiconductor element 21A are connected to the electrodes 53 of the wiring board 51 where the adhesive 52 is applied. If the amount of application of the adhesive 52 is too much, the adhesive 52 creeps up on the side surface of the semiconductor element 21A so as to be beyond the thickness of the semiconductor element 21A. See FIG. 16.

In this embodiment, the protection tape base material 33 having a size larger than the semiconductor element 21A is provided, via the second adhesive layer 84, between the rear surface of the semiconductor element 21A and the bonding tool 45. In other words, the protection tape base material 33 extends to outside of the side surface of the semiconductor element 21A at all four sides of the semiconductor element 21A.

Because of this, the flow of the adhesive 52 creeping up on the side surface of the semiconductor element 21A is blocked by the protection tape base material 33 and therefore the adhesive 52 does not reach the bonding tool 45.

Therefore, it is possible to continuously provide the semiconductor elements 21A on the large size wiring board 51 without adhesion of the adhesive 52 to the bonding tool 45.

In the meantime, the protection tape base material 33 is adhered to the rear surface of the semiconductor element 21A via the second adhesive layer 84.

On the other hand, for the bonding process, the heating temperature of the bonding tool 45 is the same as the temperature at which foaming of the second adhesive layer 84 starts. For example, if the temperature at which foaming of the second adhesive layer 84 starts is approximately 150° C., the heating temperature by the bonding tool 45 is approximately 300° C.

As a result of this, the second adhesion layer 84 provided between the rear surface of the semiconductor element 21A and the protection tape base material 33 is foamed so that the adhesion force is reduced. The protection tape base material 33 and the second adhesive layer 84 can be removed from the rear surface of the semiconductor element 21A.

Thus, due to heating by the bonding tool 45, the second adhesion layer 84 provided between the rear surface of the semiconductor element 21A and the protection tape base material 33 is foamed so that the adhesion force is reduced.

At the same time when the semiconductor element 21A is bonded on the wiring board 51 by the bonding tool 45 attracting and holding the semiconductor element 21A, it is possible that the protection tape base material 33 can be removed from the rear surface of the semiconductor element 21A.

Accordingly, it is possible that the protection tape base material 33 can be removed from the rear surface of the semiconductor element 21A in smaller steps in this embodiment compared to the first embodiment.

Next, a continuous removing tape 47 is adhered on the protection tape base material 33 where plural semiconductor elements 21A are provided. The removing tape 47 is pulled so that the protection tape base material 33 is removed from the rear surfaces of the semiconductor elements 21A. See FIG. 33.

Figure 33:
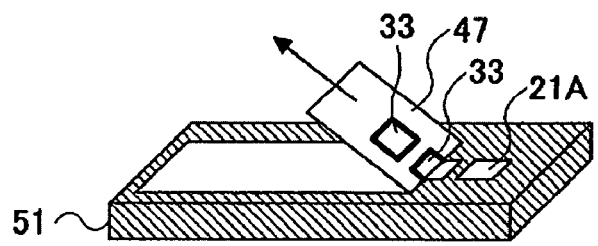
FIG. 33 is a perspective view of the manufacturing method of the semiconductor device of the second embodiment.

In other words, the removing tape 47 is pulled in the direction of an arrow in FIG. 33 so that the protection tape base material 33 adhered to the semiconductor elements 21A is removed.

There is no limitation to a material, thickness, or the like of the removing tape 47. However, adhesion capabilities whereby the protection tape base material 33 can be removed are required of the removing tape 47.

In this step, the protection tape base material 33 is removed from the rear surfaces of plural semiconductor elements 21A provided on the wiring board 51. See FIG. 34.

Next, the semiconductor elements 21A mounted and fixed on the main surface of the wiring board 51 are sealed by resin in a body. The wiring board is provided to a mold 61. Sealing resin 62 is supplied into a cavity where one of the main surfaces of the wiring board 51 is arranged so that sealing by resin is performed. See FIG. 20.

Next, plural solder balls as outside connection terminals 54 are provided on another main surface of the wiring board 51, corresponding to the electrodes 53 of the wiring board 51. See FIG. 21.

After that, the wiring board 51 and the sealing resin 62 are divided by the blade dicing method using the dicing saw 29 so that each unit has a part of the wiring board 51, one of the semiconductor elements 21A sealed by the sealing resin 62 on the main surface of the wiring board 51, the adhesive 52, and others. See FIG. 22.

As a result of this, the semiconductor element 21A is flip-chip mounted (mounted in the face-down manner) on the wiring board 51 so that the semiconductor device 71 sealed by the sealing resin 62 is formed (not illustrated). The semiconductor device 71 may be called a BGA (ball grid array) type semiconductor device.

Thus, according to the second embodiment, even if the adhesive 52 applied on the wiring board 51 in advance creeps up on the side surface of the semiconductor element 21A when the semiconductor element 21A is fixed on the wiring board 51 by using the bonding tool 45, it is possible to block the adhesive 52 from reaching the bonding tool 45 by the protection tape base material 33 having an area larger than the semiconductor element 21A and provided on the rear surface of the semiconductor elements 21A.

Accordingly, it is possible to apply a sufficient amount of the adhesive 52 without decreasing the amount of application of the adhesive 52 to the wiring board 51. Therefore, it is possible to realize adhesion of the semiconductor element 21A to the wiring board 51 with high reliability.

Furthermore, it is not necessary to add a function for detecting adhesion of the adhesive 52 to the bonding tool 45 to the apparatus configured to operate the bonding tool 45.

Figure 32:
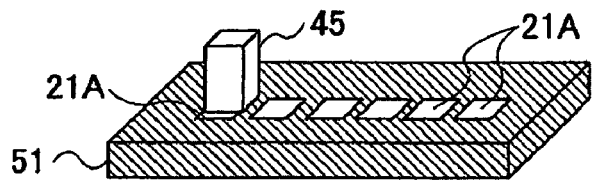
FIG. 32 is a perspective view of the manufacturing method of the semiconductor device of the second embodiment.

In the second embodiment, at the same time that the semiconductor element 21A is bonded on the wiring board 51 by the bonding tool 45 attracting and holding the semiconductor element 21A in the step illustrated in FIG. 32, it is possible that the protection tape base material 33 can be removed from the rear surface of the semiconductor element 21A.

Accordingly, it is possible that the protection tape base material 33 and the second adhesive layer 84 can be removed from the rear surface of the semiconductor element 21A in smaller steps in this embodiment compared to the first embodiment.

The present invention is not limited to these embodiments, but variations and modifications may be made without departing from the scope of the present invention.

Figure 35:
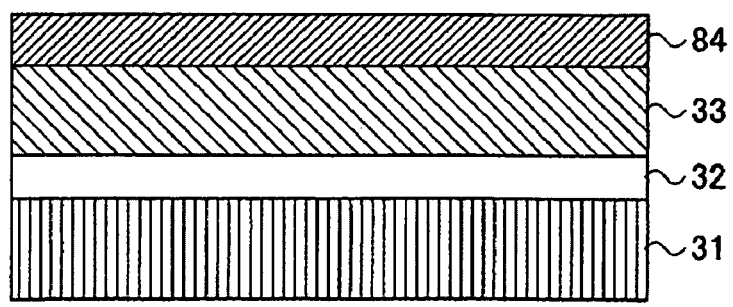
FIG. 35 is a cross-sectional view showing a structure of a modified example of tape adhered to the semiconductor substrate.

For example, the dicing tape adhered to the semiconductor substrate 21 may have a structure illustrated in FIG. 35.

In other words, the dicing tape may have a four-layer structure where the first adhesive layer 32 which is an ultraviolet curing type, the protection tape base material 33, and a second adhesive layer 84 which is a thermally foamed type are stacked on a dicing tape base material 31 in this order.

In this tape structure, in order that the protection tape base material 33 provided on the first adhesive layer 21 can be easily removed from the dicing tape base material 32, ultraviolet (UV light) is applied from the lower surface side of the dicing base material 31 so that only the first adhesive layer 32 provided on the dicing tape base material 31 is cured and the adhesion force is reduced.

Furthermore, in order that the protection tape base material 33 and the second adhesive layer 84 can be easily removed from the rear surface of the semiconductor element 21A, when the semiconductor element 21A is bonded to the wiring board 51 by using the bonding tool 45 configured to attract and hold the semiconductor element 21A, heat is applied by the bonding tool 45 and the second adhesive 84 provided between the rear surface of the semiconductor element 21A and the protection tape base material 33 is foamed so that the adhesion force is reduced.

On the other hand, instead of the above-mentioned structure, the dicing tape may have a four-layer structure where the first adhesive layer 82 which is a thermally foamed type, the protection tape base material 33, and a second adhesive layer 34 which is an ultraviolet curing type are stacked on a dicing tape base material 31 in this order.

In the above-discussed embodiments, an example of manufacturing the BGA (Ball Grid Array) type semiconductor device is discussed where the semiconductor element 21A is mounted on and connected to the surface of the wiring board 51 having the rear surface where plural solder balls as the outside connection terminals 55 are provided and the semiconductor element 21A is sealed by the sealing resin 62. However, the manufacturing method of the present invention is not limited to this semiconductor device.

Figure 36:
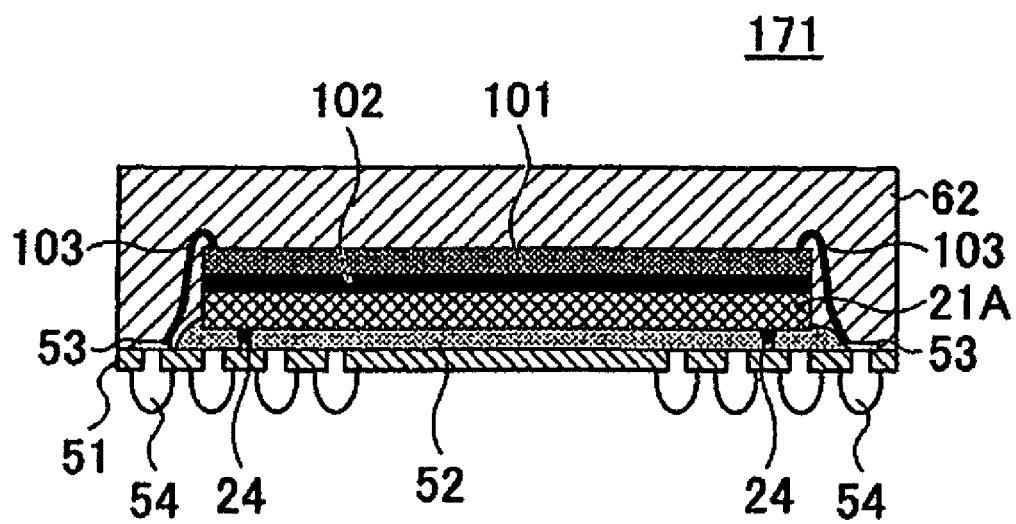
FIG. 36 is a cross-sectional view showing a first modified example of the semiconductor device where the manufacturing method of the embodiment can be applied.
Figure 37:
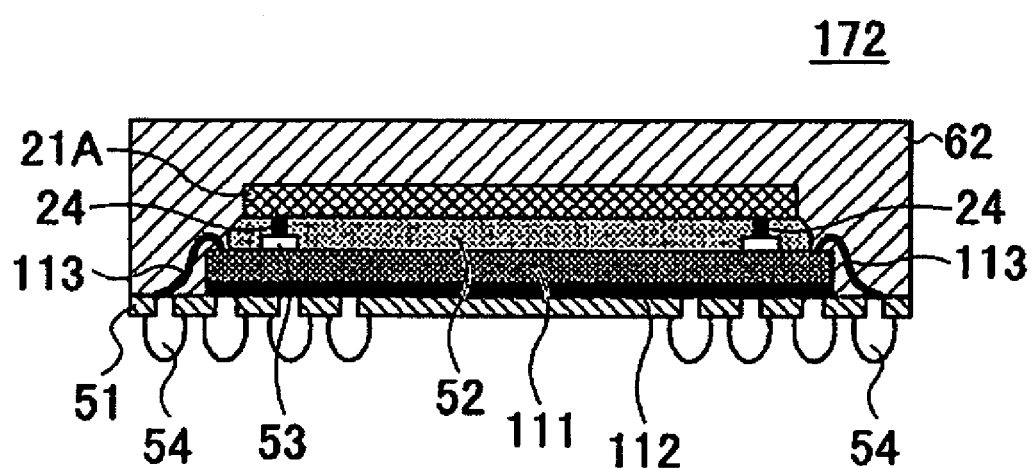
FIG. 37 is a cross-sectional view showing a second modified example of the semiconductor device where the manufacturing method of the embodiment can be applied.

In other words, the present invention can be applied to manufacturing of a semiconductor device having a structure illustrated in FIG. 36 or FIG. 37.

A semiconductor device 171 illustrated in FIG. 36 is a so-called two-stage stacked multi-chip package type semiconductor device. That is, the second semiconductor element 101 is mounted, via a die bonding material 102, on the semiconductor element 21A fixed on the wiring board 51 via the adhesive 52 where an electronic circuit forming surface of the second semiconductor element 101 faces upward.

Figure 19A:
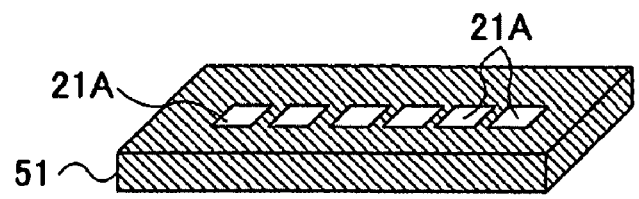
FIG. 19 is a perspective view and a main part cross-sectional view of the manufacturing method of the semiconductor device of the first embodiment.
Figure 19B:
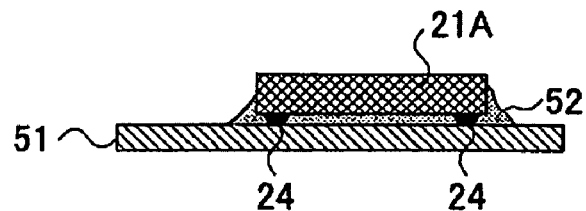
Figure 23:
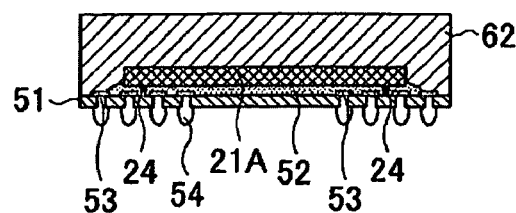
FIG. 23 is a cross-sectional view of a structure of the semiconductor device of the first embodiment.
Figure 24:
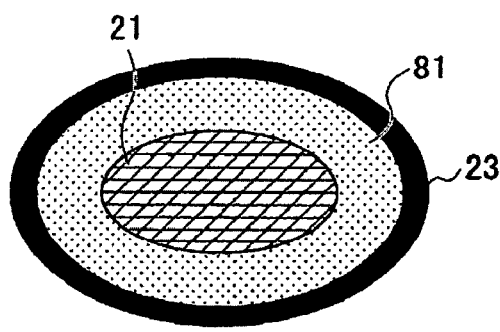
FIG. 24 is a perspective view of a manufacturing method of a semiconductor device of a second embodiment.
Figure 34:
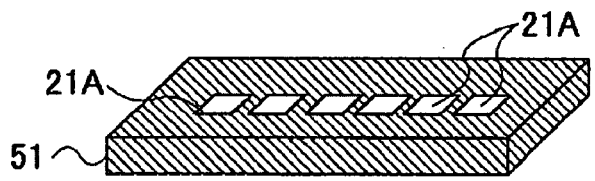
FIG. 34 is a perspective view of the manufacturing method of the semiconductor device of the second embodiment.

In manufacturing of the semiconductor device 171, after the steps illustrated in FIG. 19 or FIG. 34, the second semiconductor element 101 is mounted on the semiconductor element 21A via the die bonding material 102 such as a die bonding film where the electronic circuit forming surface of the second semiconductor element 101 faces upward. In addition, the second semiconductor element 101 and the electrodes 53 of the wiring board 51 are connected to each other by the bonding wires 103.

After that, by performing the resin sealing step, the outside connection terminal providing step, and the cutting step illustrated in FIG. 20 through FIG. 22, the semiconductor device 171 is manufactured.

A semiconductor device 172 illustrated in FIG. 37 is a so-called two-stage stacked multi-chip package type semiconductor device. That is, the semiconductor element 21A is mounted, via the adhesive 52, on the semiconductor element 111 mounted on the wiring board 51 via the die bonding material 112 where an electronic circuit forming surface of the semiconductor element 111 faces upward.

The electrodes 53 of the wiring board 51 and the semiconductor element 111 are connected to each other by the bonding wires 113.

In manufacturing the semiconductor device 172, the semiconductor element 111 is mounted on the wiring board 51 via a die bonding material 112 such as a die bonding film, and the semiconductor element 111 and the electrodes 53 of the wiring board 51 are connected to each other by the bonding wires 113. After that, in the steps illustrated in FIG. 8 through FIG. 19 and FIG. 24 through FIG. 34, the semiconductor element 21A is mounted on the semiconductor element 111 via the adhesive 52. In this case, a mounting subject of the semiconductor element 21A is the semiconductor element 111.

After that, by performing the resin sealing step, the outside connection terminal providing step, and the cutting step illustrated in FIG. 20 through FIG. 22, the semiconductor device 172 is manufactured.

In two embodiments of the present invention, the bonding tool 45 comes in contact with the rear surface of the semiconductor element 21A where the protection tape base material 33 having an area larger than that of the semiconductor element 21A is arranged via the second adhesive.

In other words, the bonding tool 45 is pressed so that the protection tape base material 33 extends to outside of the side surface of the semiconductor element 21A at all four sides of the semiconductor element 21A.

Thus, since the area of the protection base material 33 is larger than that of the semiconductor element 21A, it is possible to block the flow (creeping-up) of the adhesive at the protection tape base material 33 so that the adhesive is prevented from reaching the bonding tool 45.

In order to block the flow of the adhesive to the bonding tool 45 part, the thickness of the protection tape base material 33 may be greater so that an area where the adhesive flows increases.

Increasing of the thickness of the protection tape base material 33 reduces the heating effect of the bonding tool 45 so that handling of the protection tape base material 33 is complex. This is not preferable in practice.

As discussed above, in the manufacturing method of the semiconductor device of the embodiment, when the semiconductor elements having the projection electrodes are flip chip mounted (mounted in a face-down manner) on the supporting board such as a wiring board, it is possible to increase operations efficiency and manufacturing yield.

According to the embodiments, it is possible to provide a manufacturing method of a semiconductor device whereby it is possible to prevent an adhesive to be adhered to a wiring board from being adhered to a bonding tool so as to be solidified, without decreasing the amount of the adhesive adhered to the wiring board.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a illustrating of the superiority or inferiority of the invention. Although the embodiments of the present invention have been described in detail, it should be understood that various changes, substitutions, and alterations could be made hereto without departing from the spirit and scope of the invention.

What is claimed is:

1. A manufacturing method of a semiconductor device, comprising:
    providing an adhesive on a supporting board, the supporting board being where a semiconductor element is to be mounted;
    providing a member configured to block flow of the adhesive on a first main surface of the semiconductor element, the semiconductor element having a second main surface where an outside connection terminal is provided; and
    mounting the semiconductor element on a part of the supporting board where the adhesive is provided by pressing the semiconductor element via the member,
    wherein the member is cut while the member is adhered to a semiconductor substrate;
    the cut member has a surface larger than the second main surface of the semiconductor element that is cut off and separated from the semiconductor substrate; and
    the member and the semiconductor substrate are cut while the member is adhered on a dicing tape via a first adhesive layer and the member is adhered to the semiconductor substrate via a second adhesive layer.

2. The manufacturing method of the semiconductor device as claimed in claim 1,
    wherein a cutting width of the semiconductor substrate and the second adhesive layer is greater than a cutting width of the member and the first adhesive layer.

3. The manufacturing method of the semiconductor device as claimed in claim 2,
    wherein the semiconductor substrate and the second adhesive layer are cut by a first dicing saw;
    the member and the first adhesive layer are cut by a second dicing saw; and
    a width of the first dicing saw is greater than a width of the second dicing saw.

4. The manufacturing method of the semiconductor device as claimed in claim 2,
    wherein the first adhesive layer and the second adhesive layer are ultraviolet curing type adhesive layers; and
    the amount of irradiation of ultraviolet necessary to start curing of the second adhesive layer is greater than the amount of irradiation of the ultraviolet necessary to start curing of the first adhesive layer.

5. The manufacturing method of the semiconductor device as claimed in claim 2,
    wherein the first adhesive layer and the second adhesive layer are thermally foamed type adhesive layers; and
    the temperature necessary to start curing of the second adhesive layer is higher than the temperature necessary to start curing of the first adhesive layer.

6. The manufacturing method of the semiconductor device as claimed in claim 2,
    wherein the first adhesive layer is an ultraviolet curing type adhesive layer; and
    the second adhesive layer is a thermally foamed type adhesive layer.

7. The manufacturing method of the semiconductor device as claimed in claim 1,
    wherein the semiconductor substrate and the second adhesive layer are cut by a first dicing saw;
    the member and the first adhesive layer are cut by a second dicing saw; and
    a width of the first dicing saw is greater than a width of the second dicing saw.

8. The manufacturing method of the semiconductor device as claimed in claim 7, wherein the first adhesive layer and the second adhesive layer are ultraviolet curing type adhesive layers; and the amount of irradiation of ultraviolet necessary to start curing of the second adhesive layer is greater than the amount of irradiation of the ultraviolet necessary to start curing of the first adhesive layer.

9. The manufacturing method of the semiconductor device as claimed in claim 7, wherein the first adhesive layer and the second adhesive layer are thermally foamed type adhesive layers; and the temperature necessary to start curing of the second adhesive layer is higher than the temperature necessary to start curing of the first adhesive layer starts.

10. The manufacturing method of the semiconductor device as claimed in claim 7, wherein the first adhesive layer is an ultraviolet curing type adhesive layer; and the second adhesive layer is a thermally foamed type adhesive layer.

11. The manufacturing method of the semiconductor device as claimed in claim 1, wherein the first adhesive layer and the second adhesive layer are ultraviolet curing type adhesive layers; and the amount of irradiation of ultraviolet necessary to start curing of the second adhesive layer is greater than the amount of irradiation of the ultraviolet necessary to start curing of the first adhesive layer.

12. The manufacturing method of the semiconductor device as claimed in claim 11, wherein, after the member is cut, the ultraviolet is applied from the dicing tape side so that the first adhesive layer is cured and the member adhered to the semiconductor element can be removed from the dicing tape.

13. The manufacturing method of the semiconductor device as claimed in claim 11, wherein, after bonding, ultraviolet is applied from the member side so that the second adhesive layer is cured and the member can be removed from the rear surface of the semiconductor element.

14. The manufacturing method of the semiconductor device as claimed in claim 1, wherein the first adhesive layer and the second adhesive layer are thermally foamed type adhesive layers; and the temperature necessary to start curing of the second adhesive layer is higher than the temperature necessary to start curing of the first adhesive layer.

15. The manufacturing method of the semiconductor device as claimed in claim 14, wherein, after the member is cut, heat is applied from the dicing tape side so that the first adhesive layer is foamed and the member adhered to the semiconductor element can be removed from the dicing tape.

16. The manufacturing method of the semiconductor device as claimed is claim 14, wherein, at the time of bonding, heat is applied to the member side so that the second adhesive layer is foamed and the member can be removed from the rear surface of the semiconductor element.

17. The manufacturing method of the semiconductor device as claimed in claim 1, wherein the first adhesive layer is an ultraviolet curing type adhesive layer; and the second adhesive layer is a thermally foamed type adhesive layer.

* * * * *